(12) United States Patent
Scott et al.

(10) Patent No.: US 9,294,045 B2
(45) Date of Patent: Mar. 22, 2016

(54) GAIN AND PHASE CALIBRATION FOR CLOSED LOOP FEEDBACK LINEARIZED AMPLIFIERS

(71) Applicant: RF Micro Devices (Cayman Islands), Ltd., George Town, Grand Cayman (KY)

(72) Inventors: Baker Scott, San Jose, CA (US); George Maxim, Saratoga, CA (US); Dirk Robert Walter Leipold, San Jose, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/215,815

(22) Filed: Mar. 17, 2014

(65) Prior Publication Data

US 2014/0266457 A1 Sep. 18, 2014

Related U.S. Application Data

(60) Provisional application No. 61/793,583, filed on Mar. 15, 2013, provisional application No. 61/789,508, filed on Mar. 15, 2013, provisional application No. 61/800,772, filed on Mar. 15, 2013, provisional (Continued)

(51) Int. Cl.
*H03F 1/26* (2006.01)
*H03F 3/195* (2006.01)
(Continued)

(52) U.S. Cl.
CPC .............. *H03F 1/3241* (2013.01); *H01F 27/28* (2013.01); *H01F 27/385* (2013.01); *H03F 1/32* (2013.01);
(Continued)

(58) Field of Classification Search
USPC .................. 330/149; 375/296–297; 455/114.3
See application file for complete search history.

(56) References Cited

U.S. PATENT DOCUMENTS 5,507,014 A 4/1996 Wray et al.
6,137,354 A 10/2000 Dacus et al.
(Continued)

FOREIGN PATENT DOCUMENTS

EP 1184977 A2 3/2002
WO 2005117255 A1 12/2005

OTHER PUBLICATIONS

D'Andrea, Aldo N., et al., "RF Power Amplifier Linearization through Amplitude and Phase Predistortion," IEEE Transacitons on Communications, vol. 55, No. 11, Nov. 1996, pp. 1477-1484.
(Continued)

*Primary Examiner* — Hieu Nguyen
(74) *Attorney, Agent, or Firm* — Withrow & Terranova, P.L.L.C.

(57) ABSTRACT

Embodiments of a radio frequency (RF) amplification device having an RF amplification circuit and an amplifier control circuit operably associated with the RF amplification circuit are disclosed. The RF amplification circuit is configured to amplify an RF signal in accordance with a transfer function. The amplifier control circuit includes a closed-loop linearization circuit and a calibration circuit. The closed-loop linearization circuit is configured to be activated so that the transfer function defines a closed-loop response and inactive so that the transfer function defines an open-loop response. For example, the closed-loop linearization circuit may become inactive at small-signal power levels. Accordingly, the amplifier control circuit also includes a calibration circuit configured to reduce a difference between the open-loop response and the closed-loop response of the transfer function. In this manner, the performance of the RF amplification device is maintained while the closed-loop linearization circuit is inactive.

29 Claims, 13 Drawing Sheets

Related U.S. Application Data application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014.

(51) Int. Cl.

| | |
|---|---|
| H03F 1/32 | (2006.01) |
| H03F 3/21 | (2006.01) |
| H03F 3/19 | (2006.01) |
| H03F 3/213 | (2006.01) |
| H01F 27/28 | (2006.01) |
| H01F 27/38 | (2006.01) |
| H03H 7/09 | (2006.01) |
| H03H 7/01 | (2006.01) |

(52) U.S. Cl.
CPC .............. *H03F 3/19* (2013.01); *H03F 3/195* (2013.01); *H03F 3/211* (2013.01); *H03F 3/213* (2013.01); *H03H 7/09* (2013.01); *H03H 7/1775* (2013.01)

(56) References Cited

U.S. PATENT DOCUMENTS

| | | | |
|---|---|---|---|
| 6,330,289 | B1 | 12/2001 | Keashly et al. |
| 6,707,338 | B2 | 3/2004 | Kenington et al. |
| 6,819,938 | B2 | 11/2004 | Sahota |
| 6,836,517 | B2 | 12/2004 | Nagatani et al. |
| 7,102,430 | B2 * | 9/2006 | Johnson et al. ............... 330/149 |
| 7,164,313 | B2 | 1/2007 | Capofreddi et al. |
| 7,250,815 | B2 | 7/2007 | Taylor et al. |
| 7,317,353 | B2 | 1/2008 | Hayase |
| 7,321,264 | B2 | 1/2008 | Kokkeler |
| 7,333,557 | B2 | 2/2008 | Rashev et al. |
| 7,652,532 | B2 | 1/2010 | Li et al. |
| 7,917,106 | B2 | 3/2011 | Drogi et al. |
| 7,970,360 | B2 | 6/2011 | Pei |
| 8,126,409 | B2 | 2/2012 | Osman et al. |
| 8,175,551 | B2 | 5/2012 | Akaiwa |
| 8,344,806 | B1 | 1/2013 | Franck et al. |
| 8,620,233 | B2 | 12/2013 | Brobston |
| 8,624,678 | B2 | 1/2014 | Scott et al. |
| 8,749,310 | B2 | 6/2014 | Hayes |
| 8,791,769 | B2 | 7/2014 | Leong et al. |
| 8,841,983 | B2 | 9/2014 | Newton et al. |
| 2002/0057139 | A1 | 5/2002 | Matsumura et al. |
| 2003/0008577 | A1 | 1/2003 | Quigley et al. |
| 2005/0123064 | A1 | 6/2005 | Ben-Ayun et al. |
| 2005/0195063 | A1 | 9/2005 | Mattsson |
| 2005/0237144 | A1 | 10/2005 | Einzinger et al. |
| 2006/0033602 | A1 | 2/2006 | Mattsson |
| 2006/0226943 | A1 | 10/2006 | Marques |
| 2008/0122560 | A1 | 5/2008 | Liu |
| 2011/0163824 | A1 | 7/2011 | Kawano |
| 2011/0241163 | A1 | 10/2011 | Liu et al. |
| 2012/0081192 | A1 | 4/2012 | Hanaoka |

OTHER PUBLICATIONS

Dawson, Joel L., "Feedback Linerization of RF Power Amplifiers," Dissertation for Stanford University, Stanford, Calif., Aug. 2003, 191 pages.
Hu, Q.Z., et al., "A SiGe Power Amplifier with Power Detector and VSWR Protection for TD-SCDMA Application," Proceedings of the International Conference on Mixed Design of Integrated Circuits and Systems, Jun. 22-24, 2006, Gdynia, Poland, pp. 214-217.
Nur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.
Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.
U.S. Appl. No. 14/217,199, filed Mar. 17, 2014.
U.S. Appl. No. 14/216,794, filed Mar. 17, 2014.
U.S. Appl. No. 14/215,800, filed Mar. 17, 2014.
U.S. Appl. No. 14/218,953, filed Mar. 18, 2014.
U.S. Appl. No. 14/216,376, filed Mar. 17, 2014.
U.S. Appl. No. 14/216,560, filed Mar. 17, 2014.
U.S. Appl. No. 14/555,555, filed Nov. 26, 2014.
U.S. Appl. No. 14/555,557, filed Nov. 26, 2014.
International Preliminary Report on Patentability for PCT/US/2014/030431, mailed Sep. 24, 2015, 10 pages.
Non-Final Office Action for U.S. Appl. No. 14/215,800, mailed Nov. 20, 2015, 5 pages.
Final Office Action for U.S. Appl. No. 14/217,199, mailed Oct. 19, 2015, 5 pages.
Non-Final Office Action for U.S. Appl.No. 14/216,560, mailed Jul. 16, 2015, 9 pages.
Non-Final Office Action for U.S. Appl. No. 14/218,953, mailed Jul. 24, 2015, 10 pages.
Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.
Brounley, Richard W., "Matching Networks for Power Amplifiers Operating into High VSWR Loads," High Frequency Electronics, May 2004, pp. 58-62.
Charles, C.T., "A Calibrated Phase and Amplitude Control System for a 1.9 GHz Phased-Array Transmitter Element," IEEE Transactions on Circuits and Systems I: Regular Papers, vol. 56, No. 12, Dec. 2009, pp. 2728-2737.
Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.
D'Andrea, Aldo N., et al., "Rf Power Amplifier Linearization through Amplitude and Phase Predistortion," IEEE Transactions on Communications, vol. 44, No. 11, Nov. 1996, pp. 1477-1484.
Dawson, J., et al., "Automatic Phase Alignment for a Fully Integrated Cartesian Feedback Power Amplifier System," IEEE Journal of Solid-State Circuits, vol. 38, No. 12, Dec. 2003, pp. 2269-2279.
Dawson, Joel L, "Feedback Linearization of RF Power Amplifiers," Dissertation for Stanford University, Stanford, Calif., Aug. 2003, 191 pages.
Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.
Do, Ji-Noon, et al., "W-CDMA High Power Amplifier Using Anti-Phase Intermodulation Distortion Linearization Technology," Asia-Pacific Microwave Conference, Dec. 11-14, 2007, Bangkok, Thailand, 4 pages.
Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.
Hu, Q.Z., et al., "A SiGe Power Amplifier with Power Detector and VSWR Protection for TD-SCDMA Application," Proceedings of the International Conference on Mixed Design of Integrated Circuits and Systems, June 22-24, 2006, Gdynia, Poland, pp. 214-217.
Hur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.
Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.
Keerti, Arvind, et al., "RF Characterization of SiGe HBT Power Amplifiers under Load Mismatch," IEEE Transaction on Microwave Theory and Techniques, vol. 55, No. 2, Feb. 2007, pp. 207-214.
Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.

(56) References Cited

OTHER PUBLICATIONS

Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.

Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.

Mu, Xiaofang, et al., "Analysis of Output Power Variation under Mismatched Load in Power Amplifier FEM with Directional Coupler," IEEE MTT-S International Microwave Symposium Digest, Jun. 7-12, 2009, Boston, Mass., pp. 549-552.

Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.

Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.

Rachakonda, Anil, et al., "Log Amps and Directional Couplers Enable VSWR Detection," RF Design Magazine, Jan. 2007, pp. 28-34.

Scuderi, Antonino, et al., "A VSWR-Rugged Silicon Bipolar RF Power Amplifier," Proceedings of the Bipolar/BiCMOS Circuits and Technology Meeting, Oct. 9-11, 2005, pp. 116-119.

So, Jinhyun, et al., "Digital Predistortion Based on Envelope Feedback," IEEE International Conference on Acoustics, Speech and Signal Processing (ICASSP), Mar. 25-30, 2012, Kyoto, Japan, pp. 3169-3172.

Woo, Wangmyong, et al., "A New Envelope Predistortion Linearization Architecture for Handset Power Amplifiers," IEEE Radio and Wireless Conference, Sep. 19-22, 2004, pp. 175-178.

Zhang, X., et al., "Gain/Phase Imbalance-Minimization Techniques for LINC Transmitters," IEEE Transactions on Microwave Theory and Techniques, vol. 49, No. 12, Dec. 2001, pp. 2507-2516.

International Search Report and Written Opinion for PCT/US2014/030431, mailed Jun. 20, 2014, 14 pages.

Non-Final Office Action for U.S. Appl. No. 14/216,376, mailed May 7, 2015, 8 pages.

\* cited by examiner

GAIN AND PHASE CALIBRATION FOR CLOSED LOOP FEEDBACK LINEARIZED AMPLIFIERS

RELATED APPLICATIONS

The present application claims the benefit of and priority to U.S. Provisional Patent Application No. 61/793,583, filed Mar. 15, 2013; U.S. Provisional Patent Application No. 61/789,508, filed Mar. 15, 2013; U.S. Provisional Patent Application No. 61/800,772, filed Mar. 15, 2013; U.S. Provisional Patent Application No. 61/800,991, filed Mar. 15, 2013; U.S. Provisional Patent Application No. 61/801,038, filed Mar. 15, 2013; U.S. Provisional Patent Application No. 61/946,270, filed Feb. 28, 2014; and U.S. Provisional Patent Application No. 61/946,927, filed Mar. 3, 2014.

The present application is related to concurrently filed U.S. patent application Ser. No. 14/217,199, entitled "POWER AMPLIFIER WITH WIDE DYNAMIC RANGE AM FEEDBACK LINEARIZATION SCHEME"; U.S. patent application Ser. No. 14/216,794 entitled "RF POWER AMPLIFIER WITH PM FEEDBACK LINEARIZATION"; U.S. patent application Ser. No. 14/215,800, entitled "WEAKLY COUPLED BASED HARMONIC REJECTION FILTER FOR FEEDBACK LINEARIZATION POWER AMPLIFIER"; U.S. patent application Ser. No. 14/218,953, entitled "RF POWER AMPLIFIER WITH TOTAL RADIATED POWER STABILIZATION"; U.S. patent application Ser. No. 14/216,376, entitled "AMPLIFIER PHASE DISTORTION CORRECTION BASED ON AMPLITUDE DISTORTION MEASUREMENT"; and U.S. patent application Ser. No. 14/216,560, entitled "RF REPLICATOR FOR ACCURATE MODULATED AMPLITUDE AND PHASE MEASUREMENT."

All of the applications listed above are hereby incorporated herein by reference in their entireties.

FIELD OF THE DISCLOSURE

This disclosure relates generally to radio frequency (RF) amplification devices and methods of operating the same.

BACKGROUND

Radio frequency (RF) amplification devices are used to provide amplification to RF signals. To reduce distortion, an RF amplification device may include a closed-loop control system that stabilizes the performance of the RF amplification device. Unfortunately, the closed-loop control system often has a limited power range over which it is active. For example, the closed-loop control system is not able to operate and the effectiveness of the closed-loop control system deteriorates going towards small-signal levels as the closed-loop control system becomes inactive. As such, other RF amplification devices use open-loop control systems to stabilize performance. Unfortunately, these open-loop control systems suffer from instability due to manufacturing variations, temperature variations, and supply variations. Thus, RF amplification devices are needed that can stabilize performance over a wider power range. Additionally, RF amplification devices are needed that can stabilize performance over different design corners, processes, temperatures, supplies, operating frequencies, and load impedances.

SUMMARY

This disclosure relates generally to radio frequency (RF) amplification devices and methods of operating the same. In one embodiment, an RF amplification device is provided having an RF amplification circuit and an amplifier control circuit. The RF amplification circuit is configured to amplify an RF signal in accordance with a transfer function. The amplifier control circuit is operably associated with the RF amplification circuit to control the transfer function. More specifically, the amplifier control circuit includes a closed-loop linearization circuit and a calibration circuit. When the closed-loop linearization circuit is active, the transfer function of the RF amplification circuit defines a closed-loop response. However, the transfer function of the RF amplification circuit defines an open-loop response when the closed-loop linearization circuit is inactive. For example, the closed-loop linearization circuit may become inactive at small-signal power levels so that the transfer function of the RF amplification circuit defines the open-loop response. The calibration circuit is configured to reduce a difference between the open-loop response and the closed-loop response of the transfer function. In this manner, the performance of the RF amplification device is maintained while the closed-loop linearization circuit is inactive and a power range of the RF amplification device is expanded.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
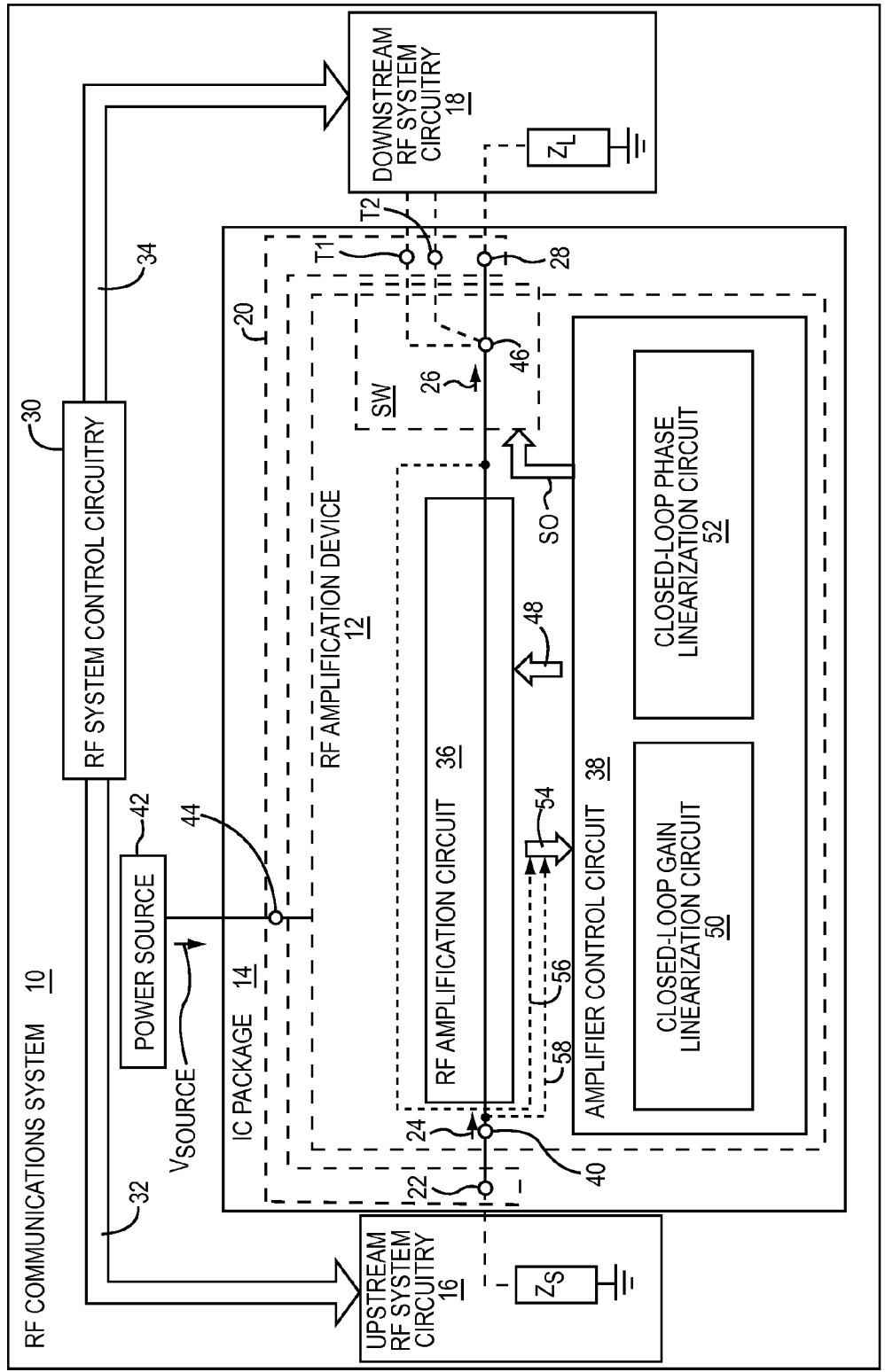
FIG. 1 illustrates a block diagram of an exemplary radio frequency (RF) communications system that includes an exemplary RF amplification device integrated into an exemplary integrated circuit (IC) package.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, pins, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

With regard to the term "endogenous," endogenous refers to a signal, parameter, or action being derived and/or originating internally within an electronic component. For example, a set point for a closed-loop circuit is established endogenously by the closed-loop circuit, if the set point is derived and/or originates internally within the closed-loop circuit. In contrast, with regard to the term "exogenous," exogenous refers to a signal, parameter, or action being derived and/or originating externally from the electronic component. For example, the set point for a closed-loop circuit is established endogenously with respect to the closed-loop circuit, if the set point is derived and/or originates in external control circuitry outside of the closed-loop circuit.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to (radio frequency) RF communication systems for transmitting and/or receiving RF signals. In particular, this disclosure relates to RF amplification devices and methods for amplifying RF signals. As such, embodiments of exemplary RF amplification devices are described herein to comprehensively explain various innovative concepts and techniques related to the disclosure. In order to help describe these innovative concepts and techniques, the exemplary RF amplification devices disclosed herein include examples of exemplary circuits and circuit elements. To further elucidate these innovative concepts and techniques, the exemplary RF amplification devices are sometimes described as being employed within certain types of RF communication systems. It should be noted that the scope of this disclosure is not limited to the exemplary RF amplification device, circuits, circuit components, and RF communication systems specifically described herein. Rather, the scope of this disclosure extends to any and all systems, devices, circuits, circuit components and methods (whether described explicitly or implicitly) in accord with the innovative concepts and techniques described in this disclosure.

The innovative concepts and techniques described in this disclosure described herein can be used to amplify an RF signal with high power efficiency and/or by introducing low distortion. While not required, the exemplary RF amplification devices may thus be used to amplify RF signals provided within various RF communication bands and/or formatted in accordance with various RF communication standards in order to allow for wide-band amplification operations. However, the exemplary RF amplification devices described may implement to operate with increased autonomy and thus provide wide-band amplification operations with less or no support from other components within the RF communication system. The exemplary RF amplification devices can thus be easily provided within the RF communication system without requiring major customization and/or coordination with other system devices.

FIG. 1 illustrates a block diagram of one embodiment of an RF communications system 10. The RF communications system 10 may be any type of communication system capable of transmitting and/or receiving wireless communications signals. For example, the RF communications system 10 may be provided as an RF front-end module in a portable computing device (i.e., cellular phone, tablet, laptop) configured to transmit and/or receive information on one or more wireless communication networks. The RF communications system 10 may include one or more antennas and various transceiver chains (i.e., receiver chains and/or transmit chains) that process RF signals within different communication bands, formatted in accordance with different RF communication standards, and/or in accordance with different RF communication specifications for these RF communication standards.

In FIG. 1, the RF communications system 10 includes an exemplary RF amplification device 12 provided in an integrated circuit (IC) package 14. The RF amplification device 12 is coupled between upstream RF system circuitry 16 and downstream RF system circuitry 18 within the RF communications system 10. For example, the upstream RF system circuitry 16, the RF amplification device 12, and downstream RF system circuitry 18 may be or may be part of either one or more transmit chains or one or more receive chains within the RF communications system 10. The IC package 14 houses the RF amplification device 12 and allows the RF amplification device 12 to transmit and receive signals within the RF communications system 10 and external to the IC package 14. More specifically, the IC package 14 includes a package interface 20 configured to connect the RF amplification device 12 to external circuitry within the RF communications system 10. It should be noted that embodiments of the RF amplification device 12 may be provided as discrete component implementations.

As shown in FIG. 1, the package interface 20 includes a first package terminus 22 coupled to the upstream RF system circuitry 16. For example, the RF communications system 10 may be an RF transceiver and the upstream RF system circuitry 16, the RF amplification device 12, and downstream RF system circuitry 18 may be provided so as to form one or more transmit chains of the RF transceiver. As such, the RF communications system 10 may be provided in a user communication device, such as a laptop, a cellular phone, a tablet, a personal computer, or the like. In a transmit chain or in transmit chains, the upstream RF system circuitry 16 may include baseband circuitry and up-conversion circuitry that generates an RF signal 24. As such, the RF signal 24 is exogenous to the IC package 14 and thus the package interface 20 is coupled to the upstream RF system circuitry 16 in order to receive the RF signal 24 when the RF signal 24 is transmitted from the upstream RF system circuitry 16. More specifically, the IC package 14 receives the RF signal 24 at the first package terminus 22. The upstream RF system circuitry 16 thus provides a source of the RF amplification device 12 and presents a source impedance $Z_S$ at the first package terminus 22.

In the transmit chain(s), the RF amplification device 12 is configured to provide amplification prior to transmission by the RF communications system 10 from an antenna. As such, the RF amplification device 12 is configured to provide amplification to the RF signal 24 and generate an amplified RF signal 26. The amplified RF signal 26 is transmitted externally from a second package terminus 28 in the package interface 20 of the IC package 14 to the downstream RF system circuitry 18. A load of the RF amplification device 12 is thus provided by the downstream RF system circuitry 18, which presents a load impedance $Z_L$ at the second package terminus 28. Since this example presumes that the downstream RF system circuitry 18 is part of one or more transmit chains, the downstream RF system circuitry 18 includes the antenna of the RF communications system 10 along with an optional impedance tuner or antenna tuner. The downstream RF system circuitry 18 thus transmits the amplified RF signal 26 to the antenna, which emits the amplified RF signal 26.

The RF amplification device 12 shown in FIG. 1 is operable to operate autonomously and thus can be implemented in the RF communications system 10 without significant customization of the other components in the RF communications system 10. For example, the RF communications system 10 includes RF system control circuitry 30 which are external to the RF amplification device 12 and the IC package 14. The RF system control circuitry 30 is configured to provide control operations to coordinate the operations of the RF communications system 10. For example, the RF system control circuitry 30 may be configured to generate system control outputs 32, 34. A system control output 32 is received by the upstream RF system circuitry 16 in order to regulate its performance. Similarly, a system control output 34 is received by the downstream RF system circuitry 18 in order to regulate its performance. For example, the system control output 34 may tune the antenna tuner within the downstream RF system circuitry 18 and vary the load impedance $Z_L$. However, in this embodiment, the IC package 14, and thus the RF amplification device 12, does not receive a control output from the RF system control circuitry 30. Thus, the RF amplification device 12 can be implemented in the RF communications system 10 with little or no customization of the RF system control circuitry 30.

Alternatively, other embodiments of the IC package 14 and the RF amplification device 12 may receive control outputs from the RF system control circuitry 30 depending on the particular application being implemented. Nevertheless, the features of the RF amplification device 12 shown in FIG. 1 allow for the RF amplification device 12 to operate with more autonomy. Furthermore, the RF amplification device 12 may be designed to have wide-band amplification capabilities. Thus, the RF amplification device 12 is operable to amplify the RF signal 24 while allowing the RF signal 24 to be provided within different RF communication bands, to be formatted in accordance with different RF communication standards, and/or to be provided in accordance with different RF communication specifications within those RF communication standards. Exemplary RF communication standards and specifications include 2G Global System for Mobile Communications (GSM) standard (i.e., a Digital Communication System (DCS) specification, a Personal Communications Service (PCS) specification), GSM specifications, Enhanced Data Rates for GSM Evolution (EDGE) specifications of the 3G standard, Wireless Fidelity (Wi-Fi) Local Area Network (LAN) standards, and/or different specifications of the Long Term Evolution (LTE) standard. Furthermore, the RF signal 24 may be multiplexed in accordance with Time Division Duplex (TDD) techniques, Frequency Division Duplex (FDD) techniques, Space Division Multiplexing (SDM), Code Division Multiple Access Multiplexing (CDMA), Orthogonal Frequency Division Multiple Access Multiplexing (OFDMA), LTE diversity techniques, Multiple-Input and Multiple-Output (MIMO) techniques, and/or the like. The RF amplification device 12 is included in an RF signal path for the RF signal 24. The RF communications system 10 may or may not define additional RF signal paths for different communication bands, specifications, and/or communication standards.

The RF amplification device 12 shown in FIG. 1 includes an RF amplification circuit 36 and an amplifier control circuit 38. Thus, the RF amplification circuit 36 and the amplifier control circuit 38 are provided within the IC package 14. The RF amplification circuit 36 is configured to receive the RF signal 24 from the first package terminus 22 at an input terminus 40. A source voltage $V_{SOURCE}$ is generated by a power source 42 and provided to the RF amplification device 12 at a third package terminus 44 in the package interface 20. The source voltage $V_{SOURCE}$ powers the RF amplification circuit 36 and the amplifier control circuit 38 in the RF amplification device 12.

The RF amplification circuit 36 is configured to amplify the RF signal 24 so as to generate the amplified RF signal 26. In other words, the RF amplification circuit 36 provides amplification to the RF signal 24 by transferring power from the source voltage $V_{SOURCE}$ to the RF signal 24 thereby generating the amplified RF signal 26. The RF amplification circuit 36 then outputs the amplified RF signal 26 after amplification from an output terminus 46 coupled to the second package terminus 28. In this manner, the amplified RF signal 26 is transmitted externally to the downstream RF system circuitry 18.

The RF amplification circuit 36 may be configured to amplify the RF signal 24 when the RF signal 24 is provided in any one of plurality of communication bands and/or is formatted in accordance with any one of a multitude of RF communication standards. Often, the RF amplification circuit 36 is divided into RF amplification stages, including one or more driver RF amplification stages and a final RF amplification stage. Alternatively, the RF amplification circuit 36 may be provided having a single amplification stage. Other circuitry may be provided in the RF amplification circuit 36 in order to provide matching and/or to provide filtering so that undesired signal components (e.g., noise, harmonics) are reduced. The RF amplification circuit 36 is configured to amplify the RF signal 24 so as to generate the amplified RF signal 26 in accordance to a transfer function of the RF amplification circuit 36. Since the transfer function of the RF amplification circuit 36 is defined from input to output, the transfer function of the RF amplification circuit 36 shown in FIG. 1 is from the input terminus 40 to the output terminus 46.

Accordingly, as shown in FIG. 1, since the RF signal 24 may be provided within different RF communication bands, may be formatted in accordance with different RF communication standards, and/or may be provided in accordance with different RF communication specifications within those RF communication standards, the RF amplification device 12 may include an optional multiple-throw switch SW between the RF amplification circuit 36 and the downstream RF system circuitry 18. In this manner, the RF signal 24 may be exogenously transmitted to different antenna/impedance tuners (not shown) and antennas (not shown) in the downstream RF system circuitry 18, which may each be designed for particular or a particular combination RF communication bands, RF communication standards, and/or RF communication specifications. In this case, the output terminus 46 may be a pole port provided in the multiple-throw switch SW. The second package terminus 28 in the package interface 20 may be a throw port of the multiple-throw switch SW. However, the multiple-throw switch SW includes any number of additional throw ports, such as the additional package termini T1, T2 in the package interface 20. The multiple-throw switch SW may be configured to selectively connect the output terminus 46 to any of the package termini T1, T2, 28. In this manner, the multiple-throw switch SW can be used to route the amplified RF signal 26 to the appropriate antenna tuner and the appropriate antenna in the downstream RF system circuitry 18. In one embodiment, the amplifier control circuit 38 is configured to generate a switching output SO to control the multiple-throw switch SW. The multiple-throw switch SW is responsive to the switching output SO so as to selectively connect the output terminus 46 to one of the package termini T1, T2, 28.

With regard to the amplifier control circuit 38, the amplifier control circuit 38 is operably associated with the RF amplification circuit 36 and is configured to control the transfer function of the RF amplification circuit 36. To do this, the amplifier control circuit 38 is configured to generate a control output 48, which may include one or more control signals that may be utilized to control the transfer function of the RF amplification circuit 36. For example, the amplifier control circuit 38 may include biasing circuitry that generates one or more bias signals, RF power converters (i.e., Low-Drop Out Regulators, RF switching converters, charge pumps, the like, or any combination thereof) that generate one or more supply voltages from the source voltage $V_{SOURCE}$ to power the RF amplification circuit 36, phase shifting components, and/or control blocks that generate control signals to adjust characteristic values in the RF amplification circuit 36. As such, the control output 48 generated by the amplifier control circuit 38 may include one or more bias signals, one or more supply voltages, and/or one or more control signals from the control blocks.

As shown in FIG. 1, the amplifier control circuit 38 also includes a closed-loop gain linearization circuit 50 and a closed-loop phase linearization circuit 52. In alternative embodiments, the amplifier control circuit 38 may have or operate only one of the two closed-loop linearization circuits 50, 52. It may also include open-loop linearization circuits. Both the closed-loop gain linearization circuit 50 and the closed-loop phase linearization circuit 52 are configured to increase linearization of a response characteristic defined by the transfer function of the RF amplification circuit 36. More specifically, with regards to the closed-loop gain linearization circuit 50, the response characteristic is a gain defined by the transfer function of the RF amplification circuit 36. Accordingly, the closed-loop gain linearization circuit 50 is configured to increase linearity of the gain of the RF amplification circuit 36. With regards to the closed-loop phase linearization circuit 52, the response characteristic is a phase shift defined by the transfer function of the RF amplification circuit 36. Accordingly, the closed-loop phase linearization circuit 52 is configured to increase linearity of the phase shift of the RF amplification circuit 36. Thus, the closed-loop phase linearization circuit 52 is configured to keep the phase shift of the RF amplification circuit 36 approximately constant. The closed-loop gain linearization circuit 50 and the closed-loop phase linearization circuit 52 provide increase linearity of the gain and the phase shift, respectively, within a communication band of interest of the RF signal 24, which may be a processed modulation signal. In some embodiments, the closed-loop gain linearization circuit 50 and the closed-loop phase linearization circuit 52 substantially linearize the gain and the phase shift, respectively. However, in other embodiments, the closed-loop gain linearization circuit 50 and the closed-loop phase linearization circuit 52 may simply reduce non-linearity.

To regulate the transfer function of the RF amplification circuit 36, the closed-loop gain linearization circuit 50 and the closed-loop phase linearization circuit 52 are each configured to generate one or more control signals. These control signals may be part of the control output 48 provided by the amplifier control circuit 38 to the RF amplification circuit 36. Thus, the control signals generated by the closed-loop gain linearization circuit 50 and the closed-loop phase linearization circuit 52 may be used to directly regulate the transfer function of the RF amplification circuit 36. Additionally and/or alternatively, the control signals may be utilized as inputs to other circuitry within the amplifier control circuit 38. For example, the control signals may be used to regulate the biasing circuitry, the RF power converters, and/or may be utilized as inputs to the control blocks that generate control signals for adjusting the characteristic values in the RF amplification circuit 36. As such, the control signals generated by the closed-loop gain linearization circuit 50 and the closed-loop phase linearization circuit 52 may be used to indirectly regulate the transfer function of the RF amplification circuit 36.

The amplifier control circuit 38 is configured to receive a control input 54 from the RF amplification circuit 36. The control input 54 may include various control signals that indicate parameter values related to the performance of the RF amplification circuit 36. In this regard, the closed-loop gain linearization circuit 50 and the closed-loop phase linearization circuit 52 are closed loop because the control signals generated by the closed-loop gain linearization circuit 50 and the closed-loop phase linearization circuit 52 depend on an output (i.e., the amplified RF signal 26) of the RF amplification circuit 36 or an analog of the output. As such, the control input 54 includes at least one feedback signal 56 that depends on the amplified RF signal 26 or an analog of the amplified RF signal 26.

As mentioned above, the RF amplification device 12 can operate autonomously while still providing wide-band amplification operations. To do this, the closed-loop gain linearization circuit 50 and the closed-loop phase linearization circuit 52 each endogenously establish a set point of the amplified RF signal 26 using the RF signal 24. Accordingly, the RF amplification device 12 and the IC package 14 do not receive an external control signal from the RF communications system 10, such as a reference signal from the RF system control circuitry 30, in order to establish the set points of the closed-loop gain linearization circuit 50 and the closed-loop phase linearization circuit 52. Instead, the closed-loop gain linearization circuit 50 and the closed-loop phase linearization circuit 52 each are configured to establish their respective set points endogenously within the IC package 14. As such, the control input 54 includes at least one reference signal 58 that depends on the RF signal 24. The control input 54 may also include exogenous control signals (e.g., from other package termini) that are received by the closed-loop gain linearization circuit 50 and/or the closed-loop phase linearization circuit 52. For example, these exogenous control signals may indicate a communication band, an RF communication standard, an RF communication specification, and/or a signal frequency of the RF signal 24. These exogenous control signals may be used to change operational characteristics of the closed-loop gain linearization circuit 50 and/or the closed-loop phase linearization circuit 52, such as an operational bandwidth and/or harmonic filter frequencies of the closed-loop gain linearization circuit 50 and/or the closed-loop phase linearization circuit 52.

While the closed-loop gain linearization circuit 50 is activate, the transfer function of the RF amplification circuit 36 defines a closed-loop gain response, and while the closed-loop gain linearization circuit 50 is inactive, the transfer function of the RF amplification circuit 36 defines an open-loop gain response. The amplified RF signal 26 has a signal amplitude, which is related to a signal amplitude (i.e., signal envelope level) of the RF signal 24 by the gain of the RF amplification circuit 36. The set point endogenously established by the closed-loop gain linearization circuit 50 is a target reference amplitude of the signal amplitude of the amplified RF signal 26. The closed-loop gain linearization circuit 50 is configured to set the target reference amplitude according to a target gain magnitude of the gain of the RF amplification circuit 36. In other words, the target reference amplitude indicates what the signal amplitude of the amplified RF signal 26 should be in order to set a gain magnitude of the gain of the RF amplification circuit 36 to the target gain magnitude. As such, the set point of the closed-loop gain linearization circuit 50 is also the target gain magnitude.

Similarly, while the closed-loop phase linearization circuit 52 is activate, the transfer function of the RF amplification circuit 36 defines a closed-loop phase response and, while the closed-loop phase linearization circuit 52 is inactive, the transfer function of the RF amplification circuit 36 defines an open-loop phase response. The set point endogenously established by the closed-loop phase linearization circuit 52 is a target reference phase of the amplified RF signal 26. The amplified RF signal 26 has a signal phase, which is related to a signal phase of the RF signal 24 by a phase shift of the RF amplification circuit 36. The closed-loop gain linearization circuit 50 is configured to set the target reference phase based on the target phase magnitude of the phase shift provided by the RF amplification circuit 36. For example, if the target phase magnitude is approximately zero (0) degrees, then the target reference phase may be approximately equal to the signal phase of the RF signal 24. If the target phase magnitude is approximately one hundred eighty (180) degrees, then the target reference phase may be approximately equal to an inverse of the signal phase of the RF signal 24. By establishing the set points of the closed-loop gain linearization circuit 50 and the closed-loop phase linearization circuit 52 endogenously using the RF signal 24, the RF amplification device 12 can operate autonomously while increasing the linearity of the transfer function of the RF amplification circuit 36. In this manner, the RF amplification device 12 can provide high linearity amplification operations without requiring exogenous control signals from the RF communications system 10 that indicate the set points.

The embodiment of the amplifier control circuit 38 shown in FIG. 1 includes both the closed-loop gain linearization circuit 50 and the closed-loop phase linearization circuit 52. However, it should be noted that in alternative embodiments, the amplifier control circuit 38 may only include either the closed-loop gain linearization circuit 50 or the closed-loop phase linearization circuit 52. Whether both or either of the closed-loop gain linearization circuit 50 and the closed-loop phase linearization circuit 52 are provided may depend on the particular performance characteristics of the RF amplification circuit 36.

Figure 2:
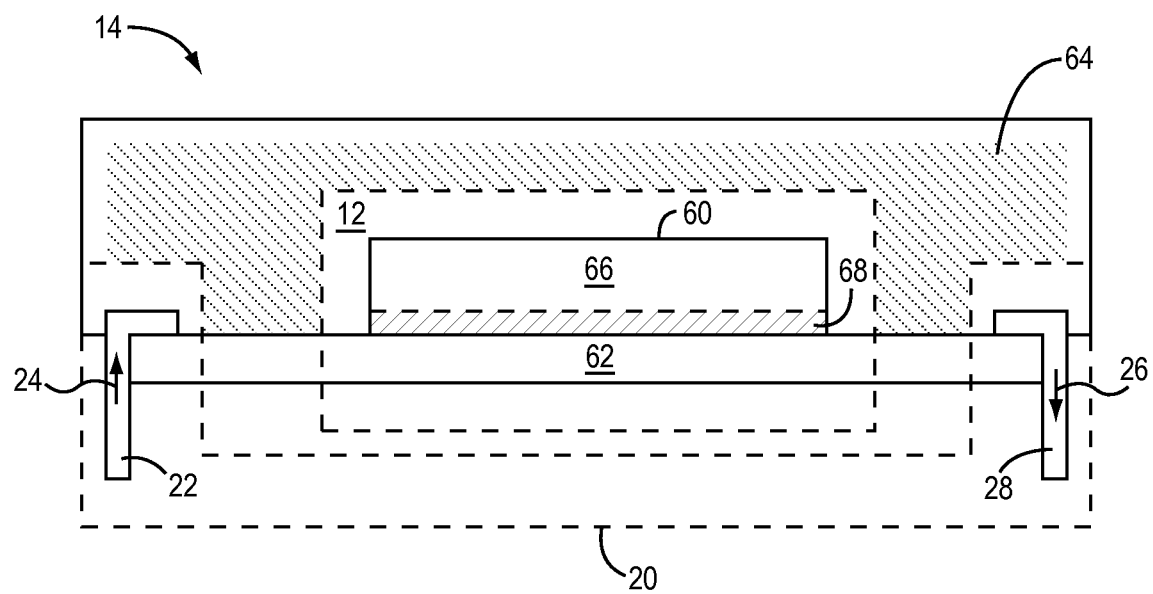
FIG. 2 is a cross-sectional view of an exemplary physical layout of the IC package shown in FIG. 1.

FIG. 2 is a cross-sectional view of an exemplary physical layout of the IC package 14 shown in FIG. 1. The RF amplification device 12 is integrated into the IC package 14 so that the IC package 14 houses the RF amplification device 12. The IC package 14 includes a semiconductor die 60, a package board 62, molding 64, and an exemplary embodiment of the package interface 20 described above in FIG. 1. An IC is formed by the semiconductor die 60. The RF amplification device 12 may be formed partially or entirely by the semiconductor die 60 depending on the application and topology of the RF amplification device 12. In alternative embodiments, the IC package 14 may include multiple semiconductor dice (like the semiconductor die 60) and the RF amplification device 12 may be built on the multiple semiconductor dies. For example, the RF amplification circuit 36 (shown in FIG. 1) and the amplifier control circuit 38 (shown in FIG. 1) may be formed on separate semiconductor dice. Additionally, one or more of the RF amplifier stages 36A, 36B, 36C (shown in FIG. 1) may be built on separate semiconductor dice. Furthermore, the closed-loop gain linearization circuit 50 and the closed-loop phase linearization circuit 52 may be built on separate semiconductor dice. Other types of substrates may be mounted in the IC package 14, such as glass substrates, plastic substrates, or any type of substrate made from a suitable substrate material. Portions of the RF amplification device 12 may be formed on these other types of substrates. These and other combinations would be apparent to one of ordinary skill in the art in light of this disclosure.

With regard to the semiconductor die 60 shown in FIG. 1, the semiconductor die 60 includes a semiconductor substrate 66 used to form active semiconductor components of the IC. The semiconductor substrate 66 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or a bottom of the semiconductor substrate 66 to provide termini of the active semiconductor components, to form passive impedance elements, and/or the like. Insulating layers, such as oxide layers, and metal layers may also be provided in or on the semiconductor substrate 66. For example, the passive impedance elements may also be formed in or on the semiconductor substrate 66 from the metallic layers.

The semiconductor die 60 also includes a Back-End-of-Line (BEOL) 68, which may be formed from a non-conductive substrate and a plurality of metallic layers provided on or in the insulating substrate. The BEOL 68 is configured to couple the components on the semiconductor substrate 66 to one another. Termini may also be provided by the BEOL 68 to provide connections by external components to the IC. The BEOL 68 may also be used to form passive impedance elements.

A topology of the semiconductor die 60 formed by the semiconductor substrate 66 and the BEOL 68 that form the IC may be in accordance to any suitable semiconductor technology, such as Complementary Metal-On-Oxide Semiconductor technology (CMOS), Bipolar-Complementary Metal-On-Oxide Semiconductor technology (BiCMOS), Silicon-On-Insulator technology (SOI), and/or the like. In this embodiment, the topology of the semiconductor die 60 is provided in accordance with CMOS technology since it is inexpensive, allows the IC to be small, and allows for easy manufacturing. The closed-loop gain linearization circuit 50 (shown in FIG. 1) and the closed-loop phase linearization circuit 52 (shown in FIG. 1) allow for the topology of the semiconductor die 60 to be provided in accordance with CMOS technology while still providing high linearity amplification operations.

The semiconductor die 60 is mounted on the package board 62 within the IC package 14. The package board 62 may be formed by a plurality of board layers formed from a non-conductive material and metallic layers. The non-conductive material that forms the board layers may be a dielectric, a laminate, fibers, glass, ceramic, and/or the like. The dielectric may be a Silicon Oxide ($SiO_x$), Silicon Nitride ($SiN_x$), and/or the like. The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The metallic layers of the package board may be used to form termini, passive impedance components, and connections. For instance, the metallic layers are used form connections between the semiconductor die 60 and the package interface 20. Also, although the RF amplification device 12 may be provided entirely by the IC formed by the semiconductor die 60, components of the RF amplification device 12 may also be formed using the metallic layers in the package board 62. The semiconductor die 60 shown in FIG. 2 is encapsulated by the molding 64, which may be formed from a non-conductive material to help insulate the semiconductor die 60 and the RF amplification device 12. In this manner, the semiconductor die 60 is protected from external electromagnetic noise generated outside the IC package 14.

FIG. 2 also illustrates an example of the package interface 20. In this embodiment, the package interface 20 is coupled to the package board 62 so that signals can be transmitted to and received from circuitry external to the IC package 14. An embodiment of the first package terminus 22 for receiving the RF signal 24 and an embodiment of the second package terminus 28 for transmitting the amplified RF signal 26 are shown in FIG. 2. In this embodiment, the first package terminus 22 and the second package terminus 28 are each provided as pins connected to the package board 62. An embodiment of the third package terminus 44 (shown in FIG. 1 but not FIG. 2) is also provided as a pin connected to the package board 62. As mentioned above, the RF amplification device 12 may be configured to operate autonomously and thus the IC package 14 may have a small number of pins. For example, the IC package 14 may be less than eleven (11) pins. In this embodiment, the IC package 14 has a total of eight (8) pins.

Figure 3:
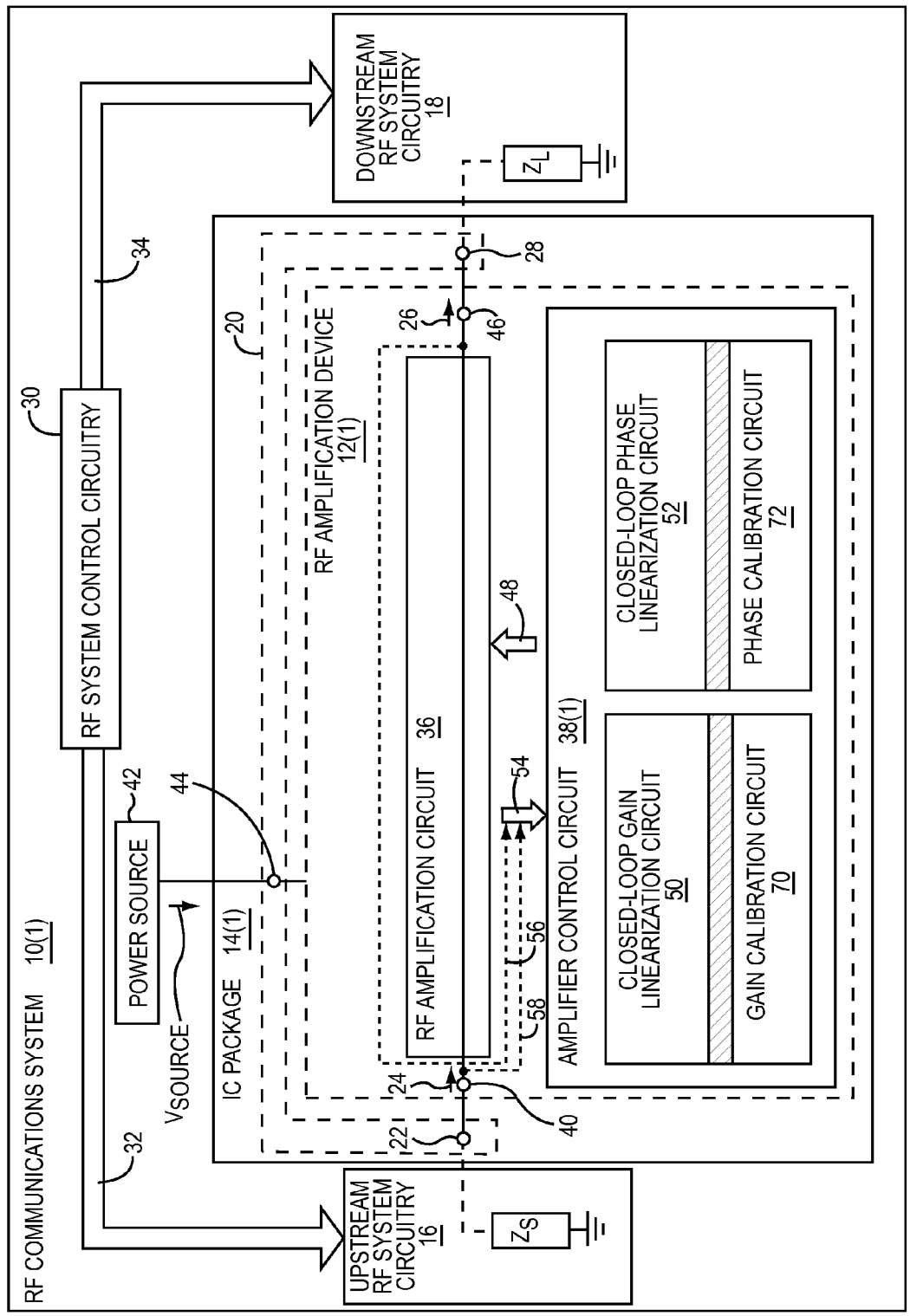
FIG. 3 is a block diagram of another exemplary RF communications system, RF amplification device, and IC package, which are embodiments of the RF communications system, the RF amplification device, and the IC package shown in FIG. 1.

Referring now to FIG. 3, FIG. 3 is a block diagram of another exemplary RF communications system 10(1), RF amplification device 12(1), and an IC package 14(1) that houses the RF amplification device, which are embodiments of the RF communications system 10, the RF amplification device 12, and the IC package 14 described above in FIG. 1. The RF amplification device 12 also includes the RF amplification circuit 36 described above with respect to FIG. 1 along with an amplifier control circuit 38(1). The amplifier control circuit 38(1) is one embodiment of the amplifier control circuit 38 described above with respect to FIG. 1. However, in this embodiment, the amplifier control circuit 38(1) further includes a gain calibration circuit 70 and a phase calibration circuit 72. Alternative embodiments of the amplifier control circuit 38(1) may include only the gain calibration circuit 70 or the phase calibration circuit 72.

Slanted lines are included between the gain calibration circuit 70 and the closed-loop gain linearization circuit 50 in order to indicate that the gain calibration circuit 70 and the closed-loop gain linearization circuit 50 may be partially integrated with one another (and thus share components) or may be independent (and thus not share components). As explained in further below, at small-signal power levels, the closed-loop gain linearization circuit 50 may be deactivated and thus the RF amplification circuit 36 may amplify the RF signal 24 in accordance with the open-loop gain response defined by the transfer function of the RF amplification circuit 36. At these small-signal power levels when the closed-loop gain linearization circuit 50 is inactive, the open-loop gain response may be substantially linear. As discussed above, while the closed-loop gain linearization circuit 50 is activate, the closed-loop gain response defined by the transfer function is also linear. However, without the gain calibration circuit 70, the gain of the RF amplification circuit 36 may be different during the closed-loop gain response and the open-loop gain response. The gain calibration circuit 70 is configured to reduce a difference between the closed-loop gain response and the open-loop gain response. For example, the gain calibration circuit 70 may be configured to substantially eliminate the difference between the closed-loop gain response and the open-loop gain response. Accordingly, the gain of the RF amplification circuit 36 may be substantially the same during the closed-loop gain response and the open-loop gain response.

With regard to the phase-calibration circuitry, slanted lines are included between the phase calibration circuit 72 and the closed-loop phase linearization circuit 52 in order to indicate that the phase calibration circuit 72 and the closed-loop phase linearization circuit 52 may be partially integrated with one another (and thus share components) or may be independent (and thus not share components). As explained further below, at small-signal power levels, the closed-loop phase linearization circuit 52 may be inactive and thus the RF amplification circuit 36 may amplify the RF signal 24 in accordance with the open-loop phase response defined by the transfer function of the RF amplification circuit 36. At these small-signal power levels when the closed-loop phase linearization circuit 52 is inactive, the open-loop phase response may be substantially linear. As discussed above, while the closed-loop phase linearization circuit 52 is activate, the closed-loop phase response defined by the transfer function is also linear. However, without the phase calibration circuit 72, the phase shift of the RF amplification circuit 36 may be different during the closed-loop phase response and the open-loop phase response. The phase calibration circuit 72 is configured to reduce a difference of the closed-loop phase response and the open-loop phase response. For example, the phase calibration circuit 72 may be configured to substantially eliminate the difference between the closed-loop phase response and the open-loop phase response. Accordingly, the phase shift of the RF amplification circuit 36 may be substantially the same during the closed-loop phase response and the open-loop phase response.

Figure 4:
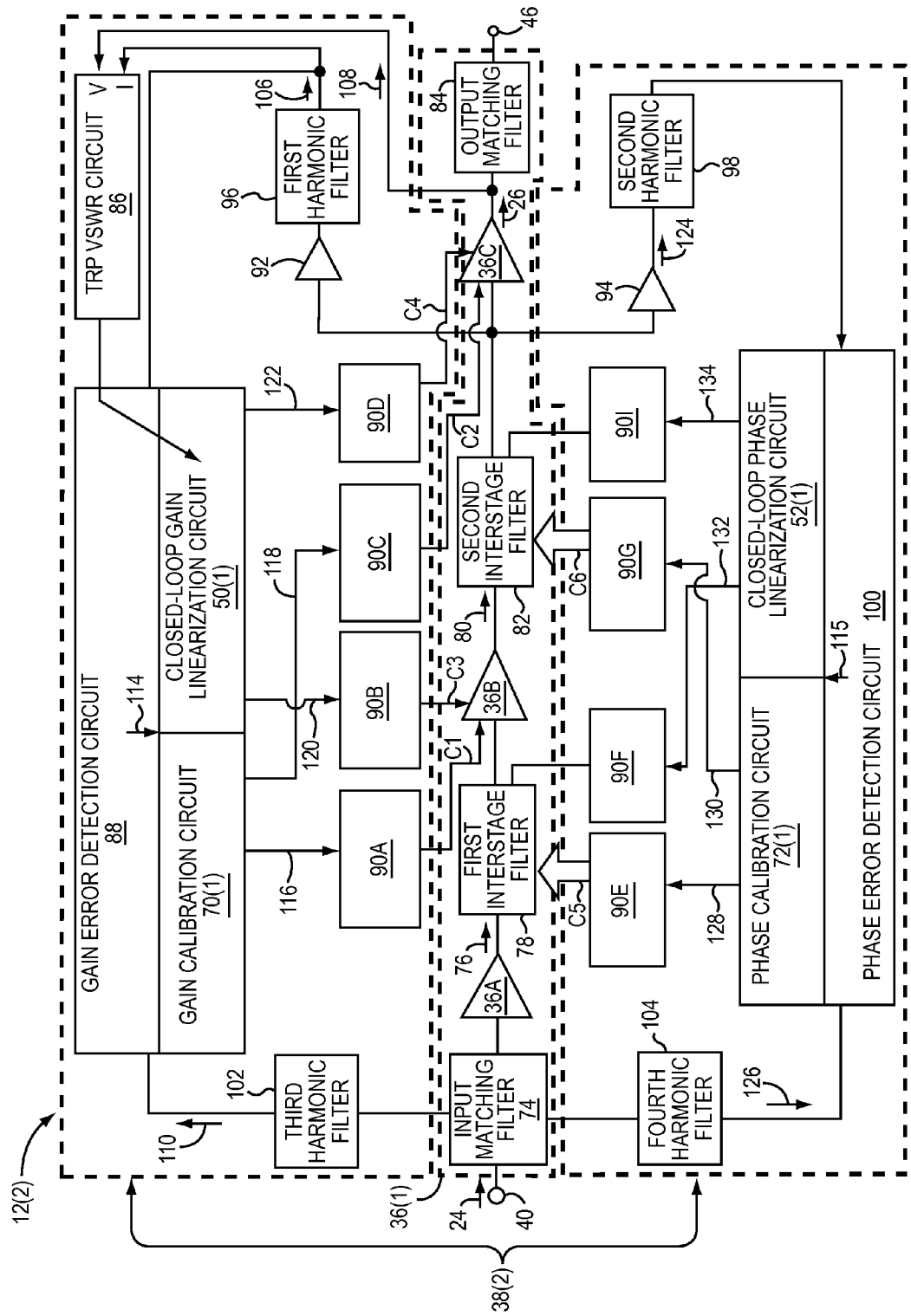
FIG. 4 is a block diagram of another embodiment of an RF amplification device, which is a more detailed example of the RF amplification device shown in FIG. 3.

FIG. 4 illustrates a block diagram of another embodiment of an RF amplification device 12(2), which is a more detailed example of the RF amplification device 12(1) shown in FIG. 3. The RF amplification device 12(2) includes one embodiment of an RF amplification circuit 36(1) and an embodiment of an amplifier control circuit 38(2). The RF amplification circuit 36(1) is one embodiment of the RF amplification circuit 36 described above in FIG. 1. However, in this embodiment, the RF amplification circuit 36(1) includes a plurality of RF amplifier stages 36A, 36B, 36C coupled in cascade. Accordingly, each of the plurality of RF amplifier stages 36A, 36B, 36C is operable to provide amplification and by being coupled in cascade, the RF amplifier stages 36A, 36B, 36C provide amplification to the RF signal 24 in sequence.

The RF amplification circuit 36(1) shown in FIG. 1 has an initial RF amplifier stage 36A, an intermediate RF amplifier stage 36B, and a final RF amplifier stage 36C. However, other embodiments of the RF amplification circuit 36(1) may include any number of RF amplifier stages as described above. Often, the initial RF amplifier stage 36A and the intermediate RF amplifier stage 36B are classified as "driver" RF amplifier stages. Since the final RF amplifier stage 36C handles the most power, some embodiments of the final RF amplifier stage 36C may include arrays of transistors or stacks of transistors in order to handle the power levels seen by the final RF amplifier stage 36C.

In this embodiment, an input matching filter 74 is configured to initially receive the RF signal 24 from the input terminus 40. The input matching filter 74 is configured to substantially match an input impedance of the RF amplification circuit 36(1) to the source impedance $Z_S$ (shown in FIG. 1) of the upstream RF system circuitry 16 (shown in FIG. 1). Since the RF amplifier stages 36A, 36B, 36C are coupled in cascade, the RF amplifier stages 36A, 36B, 36C provide amplification to the RF signal 24 in a sequence. Accordingly, the initial RF amplifier stage 36A receives the RF signal 24 from the input matching filter 74. The initial RF amplifier stage 36A is configured to amplify the RF signal 24 so as to generate a first interstage RF signal 76 in accordance with an amplifier gain $G_{initial}$. A first interstage filter 78 is coupled between the initial RF amplifier stage 36A and the intermediate RF amplifier stage 36B. The first interstage filter 78 is configured to filter undesired signal components (e.g., noise and/or harmonics) from the first interstage RF signal 76 after amplification by the initial RF amplifier stage 36A. Once the RF signal 24 is amplified by the initial RF amplifier stage 36A and the first interstage RF signal 76 has been filtered by the first interstage filter 78, the intermediate RF amplifier stage 36B receives the first interstage RF signal 76.

The intermediate RF amplifier stage 36B is configured to amplify the first interstage RF signal 76 so as to generate a second interstage RF signal 80 in accordance with an amplifier gain $G_{intermediate}$. A second interstage filter 82 is coupled between the intermediate RF amplifier stage 36B and the final RF amplifier stage 36C. The second interstage filter 82 is configured to filter undesired harmonics from the second interstage RF signal 80 after amplification by the intermediate RF amplifier stage 36B. Once the first interstage RF signal 76 is amplified by the intermediate RF amplifier stage 36B and the second interstage RF signal 80 has been filtered by the second interstage filter 82, the final RF amplifier stage 36C receives the second interstage filter 82. The final RF amplifier stage 36C is configured to amplify the RF signal 24 so as to generate the amplified RF signal 26 in accordance to an amplifier gain $G_{final}$. As such, the gain of the RF amplification circuit 36(1) may be described as $G_{initial} * G_{intermediate} * G_{final}$. An output matching filter 84 is coupled to the final RF amplifier stage 36C so as to receive the amplified RF signal 26. The output matching filter 84 is configured to substantially match an output impedance of the RF amplification circuit 36(1) to the load impedance $Z_L$ (shown in FIG. 1) of the downstream RF system circuitry 18 (shown in FIG. 1).

The amplifier gain $G_{initial}$, the amplifier gain $G_{intermediate}$, and the amplifier gain $G_{final}$ may each be any type of amplifier gain (e.g., a voltage gain, a transconductance gain, a transresistance gain, a current gain) depending on the topology of each of the corresponding RF amplifier stages 36A, 36B, 36C. For example, the amplifier gain $G_{initial}$, the amplifier gain $G_{intermediate}$, and the amplifier gain $G_{final}$ may each be the same type of amplifier gain or each may be a different types of amplifier gain. As such, the gain of the RF amplification circuit 36(1) may be any type of amplifier gain depending on a combination of the types amplifier gain $G_{initial}$, the amplifier gain $G_{intermediate}$, and the amplifier gain $G_{final}$ provided by each of the RF amplifier stages 36A, 36B, 36C.

Note that as amplification progresses through the sequence of the RF amplifier stages 36A, 36B, 36C, each of the RF amplifier stages 36A, 36B, 36C, handles an increasing amount of power. Therefore, the initial RF amplifier stage 36A handles the least amount of power, since it receives the RF signal 24 prior to amplification and transmits the first interstage RF signal 76 amplified only in accordance with the amplifier gain $G_{initial}$. In one embodiment, the amplifier gain $G_{initial}$ is a voltage gain. Thus, the initial RF amplifier stage 36A amplifies the RF signal 24 such that the amplifier gain $G_{initial}$ approximately describes a proportion between a voltage level of the first interstage RF signal 76 and a voltage level of the RF signal 24.

When the intermediate RF amplifier stage 36B receives the first interstage RF signal 76, the first interstage RF signal 76 has already been amplified by the amplifier gain $G_{initial}$. The intermediate RF amplifier stage 36B further amplifies the first interstage RF signal 76 and generates the second interstage RF signal 80. Thus, the intermediate RF amplifier stage 36B transmits the second interstage RF signal 80 amplified in accordance with the amplifier gain $G_{initial}*G_{intermediate}$. As a result, the intermediate RF amplifier stage 36B handles an intermediate amount of power. In one embodiment, the amplifier gain $G_{intermediate}$ is a transconductance gain. Thus, the intermediate RF amplifier stage 36B amplifies the first interstage RF signal 76 such that the amplifier gain $G_{intermediate}$ approximately describes a proportion between a current level of the second interstage RF signal 80 and the voltage level of the first interstage RF signal 76.

With regard to the final RF amplifier stage 36C, the final RF amplifier stage 36C receives the second interstage RF signal 80 amplified in accordance with the aggregate amplifier gain $G_{initial}*G_{intermediate}$. As such, when the final RF amplifier stage 36C further amplifies the second interstage RF signal 80 so as to generate the amplified RF signal 26. In one embodiment, the amplifier gain $G_{final}$ is a current gain. Thus, the final RF amplifier stage 36C amplifies the second interstage RF signal 80 such that the amplifier gain $G_{final}$ approximately describes a proportion between a current level of the amplified RF signal 26 and the current level of the second interstage RF signal 80. The final RF amplifier stage 36C thus transmits the amplified RF signal 26 amplified in accordance with the (total) gain $(G_{initial}*G_{intermediate}*G_{final})$ of the RF amplification circuit 36(1). As such, the final RF amplifier stage 36C handles the most power. Furthermore the (total) gain of the RF amplification circuit 36(1) is a transconductance gain.

Alternatively, the amplifier gain $G_{final}$ of the final RF amplifier stage 36C may be a transconductance gain. In this alternative embodiment, the output matching filter 84 may be configured to present an input impedance that converts a current level of the amplified RF signal 26 provided by the final RF amplifier stage 36C into a voltage level. Additionally, in another alternative embodiment, the amplifier gain $G_{intermediate}$ of the intermediate RF amplifier stage 36B is a transconductance gain, and a load impedance of the second interstage filter 82 converts a current level of the second interstage RF signal 80 into a voltage level.

FIG. 4 also illustrates the amplifier control circuit 38(2) used to regulate the RF amplification circuit 36(1). The amplifier control circuit 38(2) includes a closed-loop gain linearization circuit 50(1), a phase calibration circuit 72(1), a gain calibration circuit 70(1), and a phase calibration circuit 72(1), which are embodiments of the closed-loop gain linearization circuit 50, the phase calibration circuit 72, the gain calibration circuit 70, and the phase calibration circuit 72 described above with respect to FIGS. 1 and 3. The amplifier control circuit 38(2) further includes a Total Radiated Power (TRP) Voltage Standing Wave Ratio (VSWR) circuit 86, a gain error detection circuit 88, a driver stage gain control block 90A, a driver stage gain control block 90B, a final stage gain control block 90C, a final stage gain control block 90D, a driver stage phase control block 90E, a driver stage phase control block 90F, a final stage phase control block 90G, a final stage phase control block 90I, a first final stage replica amplifier 92, a second final stage replica amplifier 94, a first harmonic filter 96, a second harmonic filter 98, a phase error detection circuit 100, a third harmonic filter 102, and a fourth harmonic filter 104.

The TRP VSWR circuit 86 is a closed-loop feedback control circuit configured to make a VSWR measurement and adjust a feedback gain of the closed-loop gain linearization circuit 50 in accordance with the VSWR measurement. For example, the TRP VSWR circuit 86 may be configured to adjust the feedback gain of the closed-loop gain linearization circuit 50 in accordance with the VSWR measurement so as to maintain an output power level of the amplified RF signal 26 substantially constant over a range of the load impedance $Z_L$ (shown in FIG. 1). The TRP VSWR circuit 86 may be configured to adjust the feedback gain of the closed-loop gain linearization circuit 50 in accordance with the VSWR measurement so as to maintain the closed-loop gain linearization circuit 50 out of unstable control regions. In order to make the VSWR measurement, the TRP VSWR circuit 86 is configured to receive a first feedback signal 106 and a second feedback signal 108. The first feedback signal 106 has a first feedback signal level that is indicative of a current level of the amplified RF signal 26. The second feedback signal 108 has a second feedback signal level that is indicative of a voltage level of the amplified RF signal 26. As such, the TRP VSWR circuit 86 is configured to make the VSWR measurement using the first feedback signal 106 and the second feedback signal 108. In combination, the first feedback signal level of the first feedback signal 106 and the second feedback signal level of the second feedback signal 108 are indicative of TRP of the amplified RF signal 26.

In this embodiment, the closed-loop gain linearization circuit 50 and the gain calibration circuit 70 are partially amalgamated since the closed-loop gain linearization circuit 50 and the gain calibration circuit 70 share the gain error detection circuit 88. Alternatively, the closed-loop gain linearization circuit 50 and the gain calibration circuit 70 may each have independent error detection circuits (like the gain error detection circuit 88) and may thus be independent of one another. In this embodiment, the gain error detection circuit 88 is configured to receive the first feedback signal 106 and a first reference signal 110 having a reference signal level that is indicative of a power level of the RF signal 24. Using the first reference signal 110, the gain error detection circuit 88 is configured to set the set point of the closed-loop gain linearization circuit, which is indicative of the target reference amplitude of the amplified RF signal 26. The set point therefore further indicates the target gain magnitude, and is established based on the reference signal level of the first reference signal 110. By having the TRP VSWR circuit 86 adjust the feedback gain based on the VSWR measurement and using the first feedback signal 106, the gain error detection circuit 88 is configured to provide feedback indicative of a signal power level of the amplified RF signal 26. The gain error detection circuit 88 is configured to compare the feedback and the set point to generate a gain error signal 114 having an error signal level indicative of a power level error between the feedback and the set point. For example, the reference signal level may indicate a current level of the amplified RF signal 26. Given an impedance value of the load impedance $Z_L$ (shown in FIG. 1), the current level indicates the signal power level. If the impedance value changes to a different impedance value, the TRP VSWR circuit 86 adjusts the feedback gain so that the current level of the amplified RF signal 26 continues to indicate the signal power level of the amplified RF signal 26. As such, the reference signal level also indicates the signal power level.

The gain error signal 114 is provided to the closed-loop gain linearization circuit 50(1) and the gain calibration circuit 70(1). With regard to the gain calibration circuit 70(1), the gain calibration circuit 70(1) is configured to use the gain error signal 114 to determine calibration points as explained in further detail below. In this embodiment, the gain calibration circuit 70(1) is operably associated with the driver stage gain control block 90A and the final stage gain control block 90C. As shown in the following description, two or more gain control blocks 90A, 90C can be provided to operate with more than one of the RF amplifier stages 36A, 36B, 36C. In this embodiment, the gain calibration circuit 70(1) is configured to generate a first gain calibration signal 116 which is received by the driver stage gain control block 90A and a second gain calibration signal 118 which is received by the final stage gain control block 90C. The driver stage gain control block 90A is configured to generate a control signal C1 that sets the gain of the intermediate RF amplifier stage 36B while the final stage gain control block 90C is configured to generate a control signal C2 that sets the gain of the final RF amplifier stage 36C. With the first gain calibration signal 116 and the second gain calibration signal 118, the gain calibration circuit 70(1) is configured to control the driver stage gain control block 90A and the final stage gain control block 90C and thereby control the gain of the RF amplification circuit 36(1). As explained in further detail below, the gain calibration circuit 70(1) controls the gain of the RF amplification circuit 36(1) in order to reduce the difference between the open-loop gain response and closed-loop gain response of the RF amplification circuit 36(1). In one exemplary embodiment, the driver stage gain control block 90A is an impedance control and the control signal C1 is an impedance control signal that sets an internal impedance level of the intermediate RF amplifier stage 36B. Additionally, the final stage gain control block 90C is a final stage biasing circuit and the control signal C2 is a bias signal that sets a quiescent operating level of the final RF amplifier stage 36C. In alternative embodiments, the gain control blocks 90A, 90C may be configured to control other operational characteristics such as biasing, impedance, and the like.

With regard to the closed-loop gain linearization circuit 50(1), the closed-loop gain linearization circuit 50(1) is configured to adjust the gain of the RF amplification circuit 36(1) in accordance to the gain error signal 114 while activated so as to maintain the gain of the RF amplification circuit 36(1) relatively constant. In this embodiment, the closed-loop gain linearization circuit 50(1) is operably associated with the driver stage gain control block 90B and the final stage gain control block 90D. The closed-loop gain linearization circuit 50(1) is configured to generate a first gain control signal 120 which is received by the driver stage gain control block 90B and a second gain control signal 122 which is received by the final stage gain control block 90D. The driver stage gain control block 90B is configured to generate a control signal C3 that sets the gain of the intermediate RF amplifier stage 36B while the final stage gain control block 90D 90CF is configured to generate a control signal C4 that sets the gain of the final RF amplifier stage 36C. With the first gain control signal 120 and the second gain control signal 122, the closed-loop gain linearization circuit 50(1) is configured to control the driver stage gain control block 90B and the final stage gain control block 90D and thereby control the gain of the RF amplification circuit 36(1). As explained in further detail below, the closed-loop gain linearization circuit 50(1) regulates the gain of the RF amplification circuit 36(1) in order to maintain the closed-loop gain response of the RF amplification circuit 36(1) substantially constant. In one exemplary embodiment, the driver stage gain control block 90B is an impedance control block with a low pass filter and the control signal C3 is an impedance control signal that sets an internal impedance level of the intermediate RF amplifier stage 36B. Additionally, the final stage gain control block 90D is a biasing circuit with a low pass filter and the control signal C4 is a bias signal that sets the quiescent operating level of the final RF amplifier stage 36C.

With regard to phase control, the closed-loop phase linearization circuit 52(1) and the phase calibration circuit 72(1) are partially amalgamated since the closed-loop phase linearization circuit 52(1) and the phase calibration circuit 72(1) share a phase error detection circuit 100. Alternatively, the closed-loop phase linearization circuit 52(1) and the phase calibration circuit 72(1) may each have independent error detection circuits (like the phase error detection circuit 100) and may thus be independent of one another. In this embodiment, the phase error detection circuit 100 is configured to receive a third feedback signal 124 having a third feedback signal level that indicates a phase of the amplified RF signal 26 and a second reference signal 126 having a second reference signal level that is indicative of a phase of the RF signal 24. Using the second reference signal 126, the phase error detection circuit 100 is configured to set the set point of the closed-loop phase linearization circuit 52(1), which is indicative of a target phase shift of the RF amplification circuit 36(1). The phase error detection circuit 100 is also configured to compare measure the phase shift of the RF amplification circuit 36(1) using the third feedback signal 124 and the second reference signal 126 as feedback. The phase error detection circuit 100 generates an phase error signal 115 having an error signal level indicative of a phase shift error between the feedback and the set point (reference).

The phase error signal 115 is provided to the closed-loop phase linearization circuit 52(1) and the phase calibration circuit 72(1). With regard to the phase calibration circuit 72(1), the phase calibration circuit 72(1) is configured to use the phase error signal 115 to determine calibration points as explained in further detail below. In this embodiment, the phase calibration circuit 72(1) is operably associated with the driver stage phase control block 90E and the final stage phase control block 90G. The phase calibration circuit 72(1) is configured to generate a first phase calibration signal 128 which is received by the driver stage phase control block 90E and a second phase calibration signal 130 which is received by the final stage phase control block 90G. The driver stage phase control block 90E is configured to generate a control output C5 that sets a phase shift of the intermediate RF amplifier stage 36B while the final stage phase control block 90G is configured to generate a control output C6 that sets a phase shift of the final RF amplifier stage 36C. With the first phase calibration signal 128 and the second phase calibration signal 130, the phase calibration circuit 72(1) is configured to control the driver stage phase control block 90E and the final stage phase control block 90G and thereby regulate the phase shift of the RF amplification circuit 36. As explained in further detail below, the phase calibration circuit 72(1) controls the phase shift of the RF amplification circuit 36 in order to reduce the difference between the open-loop phase response and closed-loop phase response of the RF amplification circuit 36. In one exemplary embodiment, the driver stage phase control block 90E is an impedance control circuit and the control output C5 is a control word that sets a capacitance of a capacitor bank in the first interstage filter 78. Additionally, the final stage phase control block 90G is an impedance control circuit and the control output C6 is a control word that sets a capacitance of a capacitor bank in the second interstage filter 82.

With regard to the closed-loop phase linearization circuit 52(1), the closed-loop phase linearization circuit 52(1) is configured to adjust the phase shift of the RF amplification circuit 36 in accordance to the phase error signal 115 while activated so as to maintain the phase shift of the RF amplification circuit 36 relatively constant. In this embodiment, the closed-loop phase linearization circuit 52(1) is operably associated with the driver stage phase control block 90F and the final stage phase control block 90I. The closed-loop phase linearization circuit 52(1) is configured to generate a first phase control signal 132 which is received by the driver stage phase control block 90F and a second phase control signal 134 which is received by the final stage phase control block 90I. The driver stage phase control block 90F is configured to set the phase shift of the first interstage filter 78 and/or the intermediate RF amplifier stage 36B using the first phase control signal 132, while the final stage phase control block 90I is configured to set the phase shift of the second interstage filter 82 and/or the final RF amplifier stage 36C using the second phase control signal 134. In this manner, the closed-loop phase linearization circuit 52(1) is configured to control the phase shift of the RF amplification circuit 36(1). In one exemplary embodiment, the driver stage phase control block 90F is a varactor and the first phase control signal 132 is used to set a variable capacitance of the varactor. Additionally, the final stage phase control block 90I may also be a varactor and the second phase control signal 134 is used to set a variable capacitance of the varactor.

To avoid the use of bulky couplers for power detection, a first final stage replica amplifier 92 is configured to generate the first feedback signal 106. As mentioned above, the first feedback signal level of the first feedback signal 106 is indicative of the current level of the amplified RF signal 26. However, in this embodiment, the first feedback signal 106 is not generated as direct feedback resulting from the amplified RF signal 26. Instead, the first final stage replica amplifier 92 is configured to generate the first feedback signal 106 as an analog of the amplified RF signal 26. The first final stage replica amplifier 92 is a scaled-down version of the final RF amplifier stage 36C and is coupled to receive the second interstage RF signal 80 just like the final RF amplifier stage 36C. The first final stage replica amplifier 92 is configured to generate the first feedback signal 106 such that the first feedback signal level is a scaled down replication of the current level of the amplified RF signal 26. Since the first feedback signal 106 is not filtered by the output matching filter 84, the first harmonic filter 96 is configured to filter high-frequency harmonics from the first feedback signal 106 and increase the performance of the gain error detection circuit 88. Furthermore, it should be noted that the TRP VSWR circuit 86 is coupled to receive the second feedback signal 108 before the amplified RF signal 26 is filtered by the output matching filter 84. This avoids a propagation delay of the output matching filter 84, which can be detrimental to the operations of the TRP VSWR circuit 86.

The second final stage replica amplifier 94 shown in FIG. 4 is configured to generate the third feedback signal 124. As mentioned above, the third feedback signal level of the third feedback signal 124 is indicative of the phase of the amplified RF signal 26. In this way, the static or slowly varying phase coming from the load impedance $Z_L$ (shown in FIG. 1) is rejected and only the dynamic phase variation is passed to the closed-loop phase linearization circuit 52(1). However, the third feedback signal 124 is not generated as direct feedback resulting from the amplified RF signal 26. Instead, the second final stage replica amplifier 94 is configured to generate the third feedback signal 124 as an analog of the amplified RF signal 26. The second final stage replica amplifier 94 is a scaled-down version of the final RF amplifier stage 36C and is coupled to receive the second interstage RF signal 80 just like the final RF amplifier stage 36C. The second final stage replica amplifier 94 is configured to generate the third feedback signal 124 such that a phase of the third feedback signal 124 matches the phase of the amplified RF signal 26. Since the third feedback signal 124 is not filtered by the output matching filter 84, the second harmonic filter 98 is configured to filter high-frequency harmonics from the third feedback signal 124 and increase the performance of the phase error detection circuit 100.

With regard to reference paths, the third harmonic filter 102 is configured to filter signal components (e.g., noise, harmonics) from the first reference signal 110 and increase the performance of the gain error detection circuit 88. In this manner, the input matching filter 74 can provide impedance matching with the source impedance $Z_s$ (shown in FIG. 1) while the third harmonic filter 102 removes unwanted signal components from the first reference signal 110. Similarly, the fourth harmonic filter 104 is configured to filter signal components (e.g., noise, harmonics) from the second reference signal 126 and increase the performance of the gain error detection circuit 88. In this manner, the input matching filter 74 can provide impedance matching with the source impedance $Z_s$ (shown in FIG. 1) while the fourth harmonic filter 104 removes unwanted signal components from the second reference signal 126.

FIGS. 3 and 4 illustrate examples of the RF amplification devices 12(1), 12(2) that perform calibration methods described below. For example, with regard to FIG. 3, the RF amplification device 12(1) includes the RF amplification circuit 36 with the closed-loop gain linearization circuit 50 and the closed-loop phase linearization circuit 52 that improve the linearity performance (reduce distortion) of the RF amplification circuit 36. To do this, FIG. 3 shows that the RF amplification device 12(1) uses the gain calibration circuit 70 and the phase calibration circuit 72. As described above, the closed-loop linearization circuits 50, 52 may be separate from the calibration circuits 70, 72 or may share some hardware. Both the closed-loop linearization circuits 50, 52 and the calibration circuits 70, 72 may control components placed in an RF signal path of the RF amplification circuit 36, biasing circuits, and the like.

Figure 5:
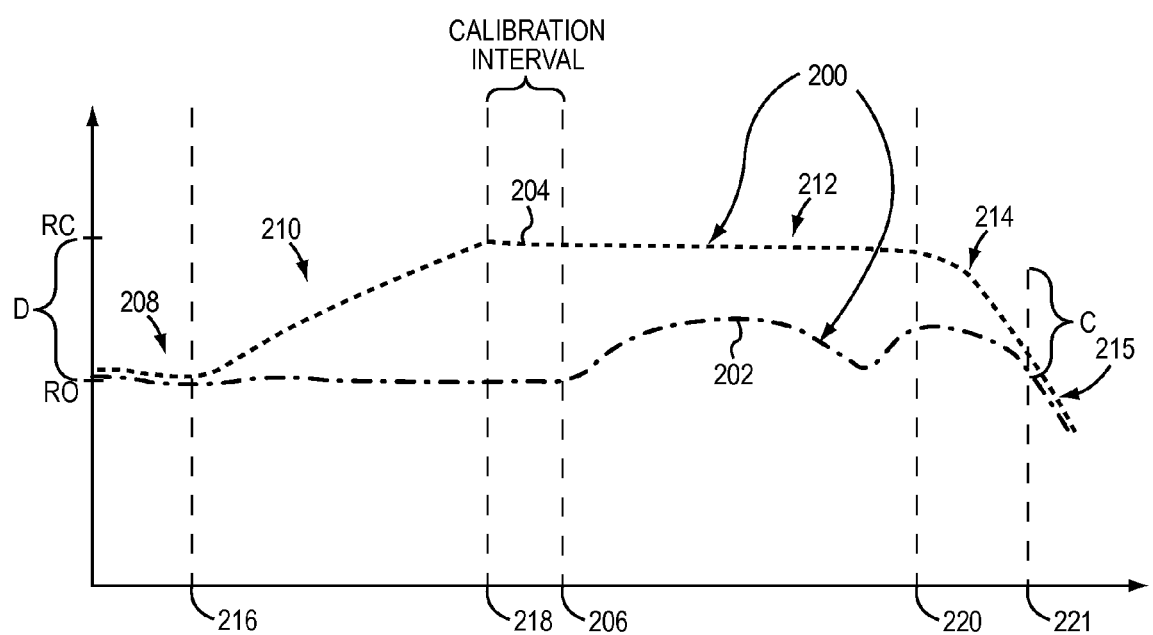
FIG. 5 illustrates embodiments of uncalibrated response characteristics for a transfer response provided by the RF amplification device shown in FIG. 3.

FIG. 5 illustrates embodiments of uncalibrated response characteristics 200 of the transfer response of the RF amplification circuit 36 (shown in FIG. 3), assuming that the gain calibration circuit 70 and/or the phase calibration circuit 72 are turned off. In this embodiment, the uncalibrated response characteristics 200 are shown mapped with respect to a signal power level (e.g., average signal power level) of the RF signal 24 shown in FIG. 3 at the input terminus 40. However, the uncalibrated response characteristics 200 would be similar at the output terminus 46, except that the uncalibrated response characteristics 200 would be scaled by the gain $G_{AMP}$ of the RF amplification circuit 36. The gain $G_{AMP}$ may not be constant, leading to differences between the two types of curves.

Prior to more fully describing the uncalibrated response characteristics 200, it should be noted that while the uncalibrated response characteristics 200 (along with other response characteristics described below) are discussed generically with respect to gain responses and phase responses, this should not be taken as an indication that gain responses and phase responses described with respect to the uncalibrated response characteristics 200 (or other response characteristics described below) are required to be similarly shaped and/or that threshold power levels (discussed below) are the same with respect to the gain responses and the phase responses. Instead, the uncalibrated response characteristics 200 (and other response characteristics) defined by the transfer function are likely, but not necessarily, shaped differently. Furthermore, at least some of the threshold power levels are likely to be different for the gain responses and the phase responses. The discussion of the uncalibrated response characteristics 200 (along with other response characteristics described below) with respect to both gain responses and phase responses is included for the sake of clarity.

Referring again to FIG. 5, the uncalibrated response characteristics 200 include a pure open-loop response characteristic 202 defined by the transfer function of the RF amplification circuit 36 if the closed-loop gain linearization circuit 50 is turned off and/or if the closed-loop phase linearization circuit 52 is turned off. For example, the pure open-loop response characteristic 202 may be a pure open-loop gain response defined by the transfer function of the RF amplification circuit 36, assuming that the gain calibration circuit 70 and the closed-loop gain linearization circuit 50 are both turned off. Additionally, the pure open-loop response characteristic 202 may be a pure open-loop phase response defined by the transfer function of the RF amplification circuit 36, assuming that the phase calibration circuit 72 and the closed-loop phase linearization circuit 52 are both turned off.

The uncalibrated response characteristics 200 also include an uncalibrated response characteristic 204 defined by the transfer function of the RF amplification circuit 36. The uncalibrated response characteristic 204 is provided when the closed-loop gain linearization circuit 50 and/or the closed-loop phase linearization circuit 52 are turned on and when the gain calibration circuit 70 and/or the phase calibration circuit 72 are turned off. For example, the uncalibrated response characteristic 204 may be an uncalibrated gain response defined by the transfer function of the RF amplification circuit 36, assuming that the gain calibration circuit 70 is turned off and the closed-loop gain linearization circuit 50 is turned on. Furthermore, the uncalibrated response characteristic 204 may be a phase response defined by the transfer function of the RF amplification circuit 36, assuming that the phase calibration circuit 72 is turned off and the closed-loop phase linearization circuit 52 is turned on.

Since the pure open-loop response characteristic 202 is a pure open-loop response (e.g., the pure open-loop gain response, the pure open-loop phase response) defined by the transfer function of the RF amplification circuit 36, the pure open-loop response characteristic 202 illustrates the behavior of the RF amplification circuit 36 without linearization from the closed-loop gain linearization circuit 50 (if the pure open-loop response characteristic 202 is the pure open-loop gain response) and/or the closed-loop phase linearization circuit 52 (if the pure open-loop response characteristic 202 is the pure open-loop phase response). The pure open-loop response characteristic 202 demonstrates that the pure open-loop response of the RF amplification circuit 36 is significantly non-linear when the power level of the RF signal 24 is above a non-linearity pure open-loop threshold power level 206. In contrast, the pure open-loop response of the RF amplification circuit 36 is substantially linear (i.e., substantially constant) below the non-linearity pure open-loop threshold power level 206. As such, the pure open-loop response characteristic 202 defined by the transfer function of the RF amplification circuit 36 has a response magnitude RO (e.g., a gain magnitude of the gain $G_{AMP}$ with respect to the pure open-loop gain response of the RF amplification circuit 36, a phase shift magnitude of the phase shift with respect to the pure open-loop phase response of the RF amplification circuit 36).

The uncalibrated response characteristic 204 is not a pure open-loop response. Rather, the uncalibrated response characteristic 204 (e.g., the uncalibrated gain response, the uncalibrated phase response) defines an open-loop response 208, an uncalibrated open-loop to closed-loop transition response 210, a closed-loop response 212, a saturation response 214, and a clipping response 215. With respect to the open-loop response 208, the open-loop response 208 is provided when the signal power level of the RF signal 24 is below a threshold power level 216. If the uncalibrated response characteristic 204 is assumed to be an uncalibrated gain response, the closed-loop gain linearization circuit 50 is turned on, but is inactive since the signal power level of the RF signal 24 is too low. Similarly, if the uncalibrated response characteristic 204 is assumed to be an uncalibrated phase response, the closed-loop phase linearization circuit 52 is turned on, but is inactive since the signal power level of the open-loop response 208 is provided at approximately the response magnitude RO, like the pure open-loop response characteristic 202.

Regarding the uncalibrated open-loop to closed-loop transition response 210, the uncalibrated open-loop to closed-loop transition response 210 is provided when the signal power level of the RF signal 24 is between the threshold power level 216 and a threshold power level 218. If the uncalibrated response characteristic 204 is assumed to be the uncalibrated gain response characteristic, the closed-loop gain linearization circuit 50 is turned on, but is only partially activated since the signal power level of the RF signal 24 is not high enough to (fully) activate the closed-loop gain linearization circuit 50. Similarly, if the uncalibrated response characteristic 204 is assumed to be an uncalibrated phase response, the closed-loop phase linearization circuit 52 is turned on, but is only partially activated since the signal power level of the RF signal 24 is not high enough to fully activate the closed-loop phase linearization circuit 52. Within the closed-loop response 212, the uncalibrated open-loop to closed-loop transition response 210 varies between the response magnitude RO and a response magnitude RC based on the signal power level of the RF signal 24.

With respect to the closed-loop response 212, the closed-loop response 212 is provided when the signal power level of the RF signal 24 is between the threshold power level 218 and a threshold power level 220. If the uncalibrated response characteristic 204 is assumed to be the uncalibrated linearized gain response, the closed-loop gain linearization circuit 50 is turned on and is (fully) activated, since the signal power level of the RF signal 24 is high enough to (fully) activate the closed-loop gain linearization circuit 50. The closed-loop gain linearization circuit 50 is fully effective to provide gain linearization so that the uncalibrated response characteristic 204 defines the closed-loop response 212 (which, in this example, is a closed-loop gain response). The closed-loop response 212 is linear (i.e., constant) and is provided at approximately the response magnitude RC (which, in this example, is a gain magnitude).

Similarly, if the uncalibrated response characteristic 204 is assumed to be an uncalibrated phase response, the closed-loop phase linearization circuit 52 is turned on and is (fully)

activated since the signal power level of the RF signal 24 is high enough to (fully) activate the closed-loop phase linearization circuit 52. The closed-loop phase linearization circuit 52 is fully effective to provide phase shift linearization. The closed-loop response 212 (which, in this example, is a closed-loop phase response) is linear (i.e., constant) and is provided at approximately the response magnitude RC (which, in this example, is a phase shift magnitude).

Note that there is a difference D between the response magnitude RO and the response magnitude RC. In this embodiment of the RF amplification device 10(1) (shown in FIG. 3), the response magnitude RO is less than the response magnitude RC. However, it should be noted that in alternative embodiments, the response magnitude RO may be greater than the response magnitude RC. This may depend on an operational design and application provided by a specific embodiment of the RF amplification device 10(1). If the uncalibrated response characteristic 204 is assumed to be the uncalibrated gain response, the difference D is a gain magnitude difference.

With respect to the saturation response 214, the saturation response 214 is provided when the signal power level of the RF signal 24 is between the threshold power level 220 and a threshold power level 221. If the uncalibrated response characteristic 204 is assumed to be the uncalibrated gain response, the closed-loop gain linearization circuit 50 is turned on, but is less effective, since the signal power level of the RF signal 24 is large and results in the RF amplification circuit 36 being weakly or strongly saturated. The same is true for the closed-loop phase linearization circuit 52, assuming that the uncalibrated response characteristic 204 is the uncalibrated phase response. With regard to the clipping response 215, the clipping response 215 is provided when the signal power level of the RF signal 24 is above the threshold power level 221. The threshold power level 221 is a clipping threshold power level. At power levels of the clipping region (which are past the (clipping) threshold power level 221), the closed-loop linearization circuits 50, 52 are on, but are completely inactive, since one or more of the components of the closed-loop linearization circuits 50, 52 are clipped (zero gain). The closed-loop linearization circuits 50, 52 may still linearize somewhat when providing the saturation response 214, but not when providing the clipping response 215.

Figure 6A:
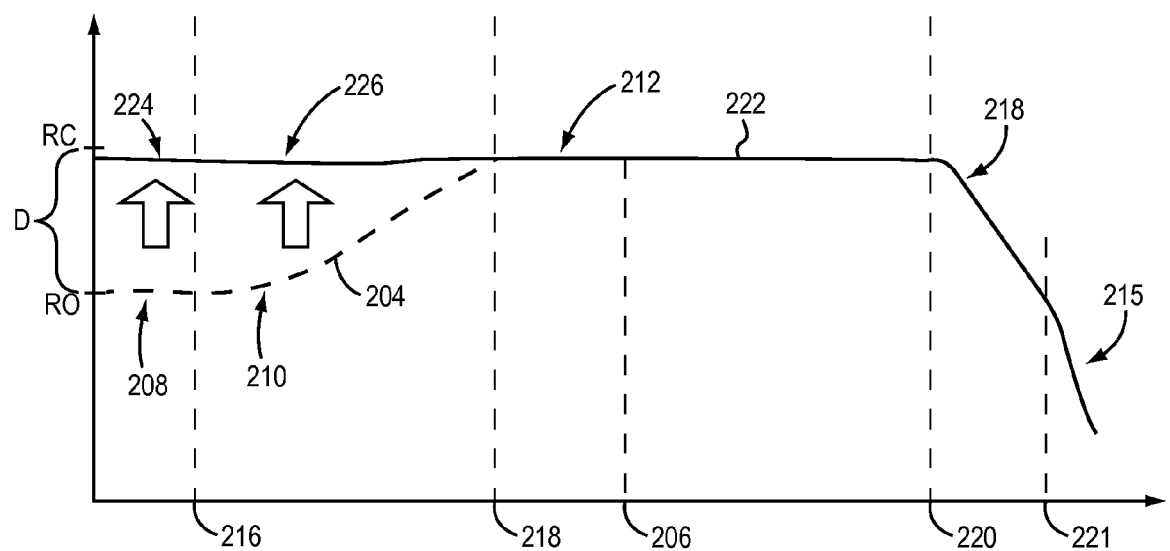
FIG. 6A illustrates one embodiment of a calibrated response characteristic defined by the transfer function of the RF amplification device shown in FIG. 3, wherein a calibrated open-loop response is adjusted toward a closed-loop response.

FIG. 6A illustrates one embodiment of a calibrated response characteristic 222 defined by the transfer function of the RF amplification circuit 36 shown in FIG. 3. As with the uncalibrated response characteristics 200 discussed above with respect to FIG. 5, the calibrated response characteristic 222 is discussed generically and may be a calibrated gain response or a calibrated phase response. The calibrated response characteristic 222 is provided when both one embodiment of the closed-loop gain linearization circuit 50 and one embodiment of the gain calibration circuit 70 are turned on and/or when both one embodiment of the closed-loop phase linearization circuit 52 and one embodiment of the phase calibration circuit 72 are turned on. For example, assuming that the calibrated response characteristic 222 is the calibrated gain response, the closed-loop gain linearization circuit 50 and the gain calibration circuit 70 are turned on. In contrast, assuming that the calibrated response characteristic 222 is the calibrated phase response, the closed-loop phase linearization circuit 52 and the phase calibration circuit 72 are turned on. In FIG. 6A, the calibration circuits 70, 72 have acted to align an open-loop small-signal response (described specifically below) to a closed-loop response (described specifically below).

As shown by FIG. 6A, the calibrated response characteristic 222 defines a calibrated open-loop response 224, a calibrated open-loop to closed-loop transition response 226, the closed-loop response 212 (which is the same as in FIG. 5), and the saturation response 214 (which is the same as in FIG. 5). The threshold power levels 206, 216, 218, 220 shown in FIG. 5 are also shown in FIG. 6A. Assuming that the calibrated response characteristic 222 is the calibrated gain response, the closed-loop gain linearization circuit 50 is configured to be (fully) activated when the RF signal 24 is between the threshold power level 218 and the threshold power level 220 such that the transfer function of the RF amplification circuit 36 defines the closed-loop response 212 (which, in this case, is the closed-loop gain response).

Although the closed-loop gain linearization circuit 50 is turned on, the closed-loop gain linearization circuit 50 is configured to be inactive below the threshold power level 216 such that the transfer function of the RF amplification circuit 36 defines the calibrated open-loop response 224 (which, in this case, is a calibrated open-loop gain response) when the signal power level of the RF signal 24 is below the threshold power level 216. The closed-loop gain linearization circuit 50 is thus configured to be inactive so that the calibrated open-loop response 224 is provided in response to a signal power level of the RF signal 24 being below the threshold power level 216.

Note, however, that unlike the open-loop response 208 of the uncalibrated response characteristic 204 shown in FIG. 5, the calibrated open-loop response 224 of the calibrated response characteristic 222 shown in FIG. 6A is set to the response magnitude RC (which, in this case, is a gain magnitude). This demonstrates the operation of one embodiment of the gain calibration circuit 70 shown in FIG. 4. The gain calibration circuit 70 is configured to reduce the difference D (which in this example is the gain magnitude difference) by adjusting the calibrated open-loop response 224. In this example, the difference D is substantially eliminated and the calibrated open-loop response 224 is adjusted by the gain calibration circuit 70 so the calibrated open-loop response 224 is substantially equal to the closed-loop response 212.

With regard to the calibrated open-loop to closed-loop transition response 226, the closed-loop gain linearization circuit 50 is configured to be only partially active (despite the closed-loop gain linearization circuit 50 being turned on) such that the transfer function of the RF amplification circuit 36 defines the calibrated open-loop to closed-loop transition response 226 (which, in this case, is a calibrated closed-loop and open-loop transition gain response) when the signal power level of the RF signal 24 is between the threshold power level 216 and the threshold power level 218. Unlike the open-loop to closed-loop transition response 210 of the uncalibrated response characteristic 204 shown in FIG. 5, the calibrated open-loop to closed-loop transition response 226 shown in FIG. 6A is provided at the response magnitude RC (which, in this case, is a gain magnitude) in response to the signal power level being between the threshold power level 216 and the threshold power level 218. The gain calibration circuit 70 is configured to reduce the difference D by adjusting the calibrated open-loop to closed-loop transition response 226 in response to the signal power level of the RF signal 24 being between the threshold power level 216 and the threshold power level 218.

When the closed-loop gain linearization circuit 50 is turned on, its action may depend on two factors. One of the factors is an error magnitude of an error signal, which is based on a difference between reference signal level(s) of the reference signal(s) 56 and feedback signal level(s) of the feedback signal(s) 58 that materializes in the distance between the response magnitude RC and the response magnitude RO. Another factor is a loop gain. The loop gain is constituted by an aggregate of all gains going around a gain loop. In general, this includes the gain $G_{AMP}$ for an amplifier forward (main) signal path and a feedback gain of a feedback path, including any detectors, attenuators, and other signal processing components. Although the closed-loop gain linearization circuit 50 is turned on, the closed-loop gain linearization circuit 50 is not providing corrections 1) if the error magnitude of the error signal is close to zero, which means that the calibrated open-loop response 224 and the closed-loop response 212 are aligned (as a result of calibration action) and/or 2) one of the components in the gain loop (including forward, reference, and feedback paths) becomes clipped and its gain goes to zero. As shown by the clipping response 215, this may occur once the signal power level of the RF signal 24 is greater than the threshold signal level 221. As such, in the uncalibrated response characteristic 204, the closed-loop gain linearization circuit 50 is turned on but inactive to provide the open-loop response 208 where the difference D is large. When the clipping response 215 is provided, the RF signal 24 is very strong, but at least one component in the gain loop (e.g., forward or feedback paths) is clipped and thus has zero gain. The closed-loop gain linearization circuit 50 is thus turned on but noncorrective even given a large difference C existing between the response magnitude RC and the response magnitude RO in the clipping response 215. In the open-loop to closed-loop transition response 210 of the uncalibrated response characteristic 204, the closed-loop gain linearization circuit 50 is on and is partially active since the signal power level of the RF signal 24 is not high enough to provide correction of the difference D. In this embodiment, the gain calibration circuit 70 provides the difference D at approximately zero to provide the calibrated open-loop to closed-loop transition response 226.

Assuming now that the calibrated response characteristic 222 is the calibrated phase response, the closed-loop phase linearization circuit 52 is configured to be (fully) activated when the RF signal 24 is between the threshold power level 218 and the threshold power level 220 such that the transfer function of the RF amplification circuit 36 defines the closed-loop response 212 (which, in this case, is the closed-loop phase response).

Although the closed-loop phase linearization circuit 52 is turned on, the closed-loop phase linearization circuit 52 is configured to be inactive below the threshold power level 216 such that the transfer function of the RF amplification circuit 36 defines the calibrated open-loop response 224 (which, in this case, is a calibrated open-loop phase response) when the RF signal 24 is below the threshold power level 216. The closed-loop phase linearization circuit 52 is thus configured to be inactive so that the calibrated open-loop response 224 is provided in response to a signal power level of the RF signal being below the threshold power level 216.

Note however, that unlike the open-loop response 208 of the uncalibrated response characteristic 204 shown in FIG. 5, the calibrated open-loop response 224 shown in FIG. 6A of the calibrated response characteristic 222 is set to the response magnitude RC (which, in this case, is a phase shift magnitude). This demonstrates the operation of one embodiment of the phase calibration circuit 72 shown in FIG. 4. The phase calibration circuit 72 is configured to reduce the difference D (which in this example is the phase shift magnitude difference) by adjusting the calibrated open-loop response 224. In this example, the difference D is substantially eliminated and the calibrated open-loop response 224 is adjusted by the phase calibration circuit 72 so that the calibrated open-loop response 224 is substantially equal to the closed-loop response 212.

With regard to the calibrated open-loop to closed-loop transition response 226, the closed-loop phase linearization circuit 52 is configured to be only partially active (despite the closed-loop phase linearization circuit 52 being turned on) such that the transfer function of the RF amplification circuit 36 defines the calibrated open-loop to closed-loop transition response 226 (which, in this case, is a calibrated closed-loop and open-loop transition gain response) when the RF signal 24 is between the threshold power level 218 and the threshold power level 216. Unlike the uncalibrated open-loop to closed-loop transition response 210 of the uncalibrated response characteristic 204 shown in FIG. 5, the calibrated open-loop to closed-loop transition response 226 shown in FIG. 6A is provided at the response magnitude RC (which, in this case, is a phase shift magnitude) in response to the signal power level being between the threshold power level 216 and the threshold power level 218. The phase calibration circuit 72 is configured to reduce the difference D by adjusting the calibrated open-loop to closed-loop transition response 226 in response to the signal power level of the RF signal 24 being between the threshold power level 216 and the threshold power level 218.

When the closed-loop phase linearization circuit 52 is turned on, its action may also depend on two factors. One of the factors is an error magnitude of an error signal, which is based on a difference between the reference signal level(s) of the reference signal(s) 56 and the feedback signal level(s) of the feedback signal(s) 58 that materializes in the distance between the response magnitude RC and the response magnitude RO. Another factor is the loop gain. The loop gain is constituted by an aggregate of all gains going around a phase loop. In general, this includes the gain $G_{AMP}$ for the amplifier forward (main) signal path and a feedback gain of a feedback path, including any detectors, attenuators, and other signal processing components. Although the closed-loop phase linearization circuit 52 is turned on, the closed-loop phase linearization circuit 52 is not providing corrections 1) if the error magnitude of the error signal is close to zero, which means that the calibrated open-loop response 224 and the closed-loop response 212 are aligned (as a result of calibration action) and/or 2) one of the components in the phase loop (including forward, reference, and feedback paths) becomes clipped and its gain goes to zero. As shown by the clipping response 215, this may occur once the signal power level of the RF signal 24 is greater than the threshold signal level 221. As such, in the uncalibrated response characteristic 204, the closed-loop phase linearization circuit 52 is turned on but inactive to provide the open-loop response 208 where the difference D is large. When the clipping response 215 is provided, the RF signal 24 is very strong, but at least one component in the phase loop (e.g., forward or feedback paths) is clipped and thus has zero gain. The closed-loop phase linearization circuit 52 is thus turned on but noncorrective even given a large difference C existing between the response magnitude RC and the response magnitude RO in the clipping response 215. In the open-loop to closed-loop transition response 210 of the uncalibrated response characteristic 204, the closed-loop phase linearization circuit 52 is on and is partially active, since the signal power level of the RF signal 24 is not high enough to provide correction of the difference D. In this embodiment, the phase calibration circuit 72 provides the difference D at approximately zero to provide the calibrated open-loop to closed-loop transition response 230.

Figure 6B:
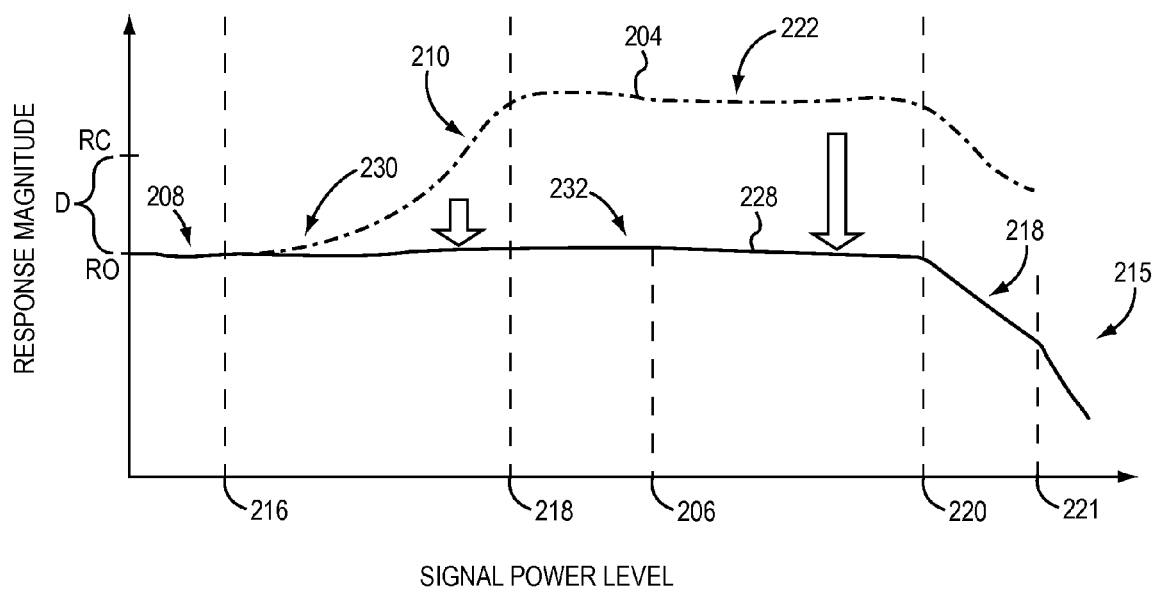
FIG. 6B illustrates another embodiment of the calibrated response characteristic defined by the transfer function of the RF amplification circuit shown in FIG. 3, wherein the calibrated closed-loop response is adjusted toward an open-loop response

FIG. 6B illustrates one embodiment of a calibrated response characteristic 228 defined by the transfer function of the RF amplification circuit 36 shown in FIG. 3. As with the uncalibrated response characteristics 200 discussed above with respect to FIG. 5, the calibrated response characteristic 228 is discussed generically and may be a calibrated gain response or a calibrated phase response. The calibrated response characteristic 228 is provided when both another embodiment of the closed-loop gain linearization circuit 50 and another embodiment of the gain calibration circuit 70 are turned on and/or when both the other embodiment of the closed-loop phase linearization circuit 52 and the other embodiment of the phase calibration circuit 72 are turned on. For example, assuming that the calibrated response characteristic 228 is the calibrated gain response, the closed-loop gain linearization circuit 50 and the gain calibration circuit 70 are turned on. In contrast, assuming that the calibrated response characteristic 228 is the calibrated phase response, the closed-loop phase linearization circuit 52 and the phase calibration circuit 72 are turned on.

Referring again to FIG. 6B, the calibrated response characteristic 228 defines the open-loop response 208 (which is the same as in FIG. 5), a calibrated open-loop to closed-loop transition response 230, a calibrated closed-loop response 232, and the saturation response 214 (which is the same as in FIG. 5). The threshold power levels 206, 216, 218, 220 shown in FIG. 5 are also shown in FIG. 6B. Assuming that the calibrated response characteristic 228 is the calibrated gain response, the closed-loop gain linearization circuit 50 is configured to be inactive below the threshold power level 216 such that the transfer function of the RF amplification circuit 36 defines the open-loop response 208 (which, in this case, is an open-loop gain response) when the RF signal 24 is below the threshold power level 216, even though the closed-loop gain linearization circuit 50 is turned on. The closed-loop gain linearization circuit 50 is thus configured to be inactive so that the open-loop response 208 is provided in response to the signal power level of the RF signal 24 being below the threshold power level 216.

The closed-loop gain linearization circuit 50 is configured to be (fully) activated when the RF signal 24 is between the threshold power level 218 and the threshold power level 220 such that the transfer function of the RF amplification circuit 36 defines the calibrated closed-loop response 232. Note, however, that unlike the closed-loop response 212 of the uncalibrated response characteristic 204 shown in FIG. 5, the calibrated closed-loop response 232 of the calibrated response characteristic 228 shown in FIG. 6B is set to the response magnitude RO (which, in this case, is a gain magnitude). This demonstrates the operation of one embodiment of the gain calibration circuit 70 shown in FIG. 4. The gain calibration circuit 70 is configured to reduce the difference D (which in this example is the gain magnitude difference) by adjusting the calibrated closed-loop response 232. In this example, the difference D is substantially eliminated and the calibrated closed-loop response 232 is adjusted by the gain calibration circuit 70 so the calibrated closed-loop response 232 is substantially equal to the open-loop response 208 at the response magnitude RO (which, in this example, is a gain magnitude). Thus, the gain calibration circuit 70 and the closed-loop gain linearization circuit 50 are configured to operate so as to adjust the calibrated closed-loop response 232 and reduce the difference D between the open-loop response 208 and the calibrated closed-loop response 232 while the signal power level of the RF signal 24 is between the threshold power level 218 and the threshold power level 220.

With regard to the calibrated open-loop to closed-loop transition response 230, the closed-loop gain linearization circuit 50 is configured to be only partially active (despite the closed-loop gain linearization circuit 50 being turned on) such that the transfer function of the RF amplification circuit 36 defines the calibrated open-loop to closed-loop transition response 230 (which, in this case, is a calibrated closed-loop and open-loop transition gain response) when the RF signal 24 is between the threshold power level 218 and the threshold power level 216. Unlike the calibrated open-loop to closed-loop transition response 226 of the calibrated response characteristic 222 shown in FIG. 6A, the calibrated open-loop to closed-loop transition response 230 shown in FIG. 6B is provided at the response magnitude RO in response to the signal power level being between the threshold power level 216 and the threshold power level 218. The gain calibration circuit 70 is configured to reduce the difference D between the open-loop response 208 and the calibrated open-loop to closed-loop transition response 230 by adjusting the calibrated open-loop to closed-loop transition response 230 in response to the signal power level of the RF signal 24 being between the threshold power level 216 and the threshold power level 218.

In this case, however, the gain calibration circuit 70 cannot eliminate the difference D on its own. Instead, the closed-loop gain linearization circuit 50 is again also used to reduce the difference D. Although the closed-loop gain linearization circuit 50 is turned on, the closed-loop gain linearization circuit 50 is configured to be only partially active when the signal power level of the RF signal 24 is between the threshold power level 216 and the threshold power level 218. However, although not fully effective, the closed-loop gain linearization circuit 50 is also configured to reduce the difference D between the calibrated open-loop to closed-loop transition response 230 and the open-loop response 208. In this case, the closed-loop gain linearization circuit 50 is configured to adjust the calibrated open-loop to closed-loop transition response 230 toward the open-loop response 208. In combination, the gain calibration circuit 70 and the closed-loop gain linearization circuit 50 eliminate the difference D and set the calibrated open-loop to closed-loop transition response 230 approximately at the response magnitude RO. The difference D shown in FIG. 6B is substantially eliminated and the calibrated open-loop to closed-loop transition response 230 is adjusted by the gain calibration circuit 70 and the closed-loop gain linearization circuit 50 in combination so that the calibrated open-loop to closed-loop transition response 230 is substantially equal to the open-loop response 208.

Assuming now that the calibrated response characteristic 228 is the calibrated phase response, the closed-loop phase linearization circuit 52 is configured to be inactive below the threshold power level 216 such that the transfer function of the RF amplification circuit 36 defines the open-loop response 208 (which, in this case, is an open-loop phase response) when the RF signal 24 is below the threshold power level 216, even though the closed-loop phase linearization circuit 52 is turned on. The closed-loop phase linearization circuit 52 is thus configured to be inactive so that the open-loop response 208 is provided in response to the signal power level of the RF signal 24 being below the threshold power level 216.

The closed-loop phase linearization circuit 52 is configured to be (fully) activated when the RF signal 24 is between the threshold power level 218 and the threshold power level 220 such that the transfer function of the RF amplification circuit 36 defines the calibrated closed-loop response 232.

Note, however, that unlike the closed-loop response 212 of the uncalibrated response characteristic 204 shown in FIG. 5, the calibrated closed-loop response 232 of the calibrated response characteristic 228 shown in FIG. 6B is set to the response magnitude RO (which, in this case, is a phase shift magnitude). This demonstrates the operation of one embodiment of the phase calibration circuit 72 shown in FIG. 4. The phase calibration circuit 72 is configured to reduce the difference D (which in this example is the phase shift magnitude difference) by adjusting the calibrated closed-loop response 232 toward the open-loop response 208. In this example, the difference D is substantially eliminated and the calibrated closed-loop response 232 is adjusted by the phase calibration circuit 72 so that the calibrated closed-loop response 232 is substantially equal to the open-loop response 208 at the response magnitude RO (which, in this example, is a phase shift magnitude). Thus, the phase calibration circuit 72 and the closed-loop phase linearization circuit 52 are configured to operate so as to adjust the calibrated closed-loop response 232 and reduce the difference D of the open-loop response 208 and the calibrated closed-loop response 232 while the signal power level of the RF signal 24 is between the threshold power level 218 and the threshold power level 220.

With regard to the calibrated open-loop to closed-loop transition response 230, the closed-loop phase linearization circuit 52 is configured to be only partially active (despite the closed-loop phase linearization circuit 52 being turned on) such that the transfer function of the RF amplification circuit 36 defines the calibrated open-loop to closed-loop transition response 230 (which, in this case, is a calibrated closed-loop and open-loop transition phase response) when the RF signal 24 is between the threshold power level 218 and the threshold power level 216. Unlike the open-loop to closed-loop transition response 226 of the calibrated response characteristic 222 shown in FIG. 6A, the calibrated open-loop to closed-loop transition response 230 shown in FIG. 6B is provided at the response magnitude RO in response to the signal power level being between the threshold power level 216 and the threshold power level 218. The phase calibration circuit 72 is configured to reduce the difference D between the open-loop response 208 and the calibrated open-loop to closed-loop transition response 230 by adjusting the calibrated open-loop to closed-loop transition response 230 in response to the signal power level of the RF signal 24 being between the threshold power level 216 and the threshold power level 218.

In this case, however, the phase calibration circuit 72 cannot eliminate the difference D on its own. Instead, the closed-loop phase linearization circuit 52 is again also used to reduce the difference D. Although the closed-loop phase linearization circuit 52 is turned on, the closed-loop phase linearization circuit 52 is configured to be only partially active when the signal power level of the RF signal 24 is between the threshold power level 216 and the threshold power level 218. However, although not fully effective, the closed-loop phase linearization circuit 52 is also configured to reduce the difference D between the calibrated open-loop to closed-loop transition response 230 and the open-loop response 208. In this case, the closed-loop phase linearization circuit 52 is configured to adjust the calibrated open-loop to closed-loop transition response 230 toward the open-loop response 208. In combination, the phase calibration circuit 72 and the closed-loop phase linearization circuit 52 eliminate the difference D and set the calibrated open-loop to closed-loop transition response 230 approximately at the response magnitude RO. The difference D shown in FIG. 6B is substantially eliminated and the calibrated open-loop to closed-loop transition response 230 is adjusted by the phase calibration circuit 72 and the closed-loop phase linearization circuit 52 in combination so the calibrated open-loop to closed-loop transition response 230 is substantially equal to the open-loop response 208.

With respect to the closed-loop response 212 and the calibrated closed-loop response 232 in FIGS. 6A and 6B, the closed-loop linearization circuits 50, 52 are turned on but are only partially active since at least one component of the loops (forward and/or feedback path) becomes partially saturated and its gain goes down, but is still higher than zero (0). In this case, the closed-loop linearization circuits 50, 52 may push the calibrated response characteristics 222, 228 toward the ideal flat response magnitude RC, but there will still be a finite error. When the signal power level of the RF signal 24 goes above the threshold power level 221, the closed-loop (gain and/or phase) linearization circuits 50, 52 become completely inactive although they are turned on. This is because at least one component in the closed-loop linearization circuits 50, 52 becomes clipped (also called fully saturated) and its gain goes to zero. In this case, the transfer response of the RF amplification device 12(1) goes back to the non-flat open loop response.

The operation of a feedback signal is described by the following equation:

$$R\text{closedloop} = R\text{openloop}/(1 + G\text{forward} * G\text{feedback}) = R\text{openloop}/(1 + G\text{loop})$$

In this equation, Rclosedloop is the response magnitude of the closed-loop response and Ropenloop is the response magnitude of the open-loop response, where Gloop is the loop gain. When the loop gain Gloop is much smaller than unity, the closed-loop response approaches the open-loop response. This may happen when Gforward and/or Gfeedback are very small, approaching zero. When the loop gain Gloop is very large, G>>1, the response characteristic Rclosed–Gloop≈Ropenloop/Gloop is different from the open-loop response.

Figure 6C:
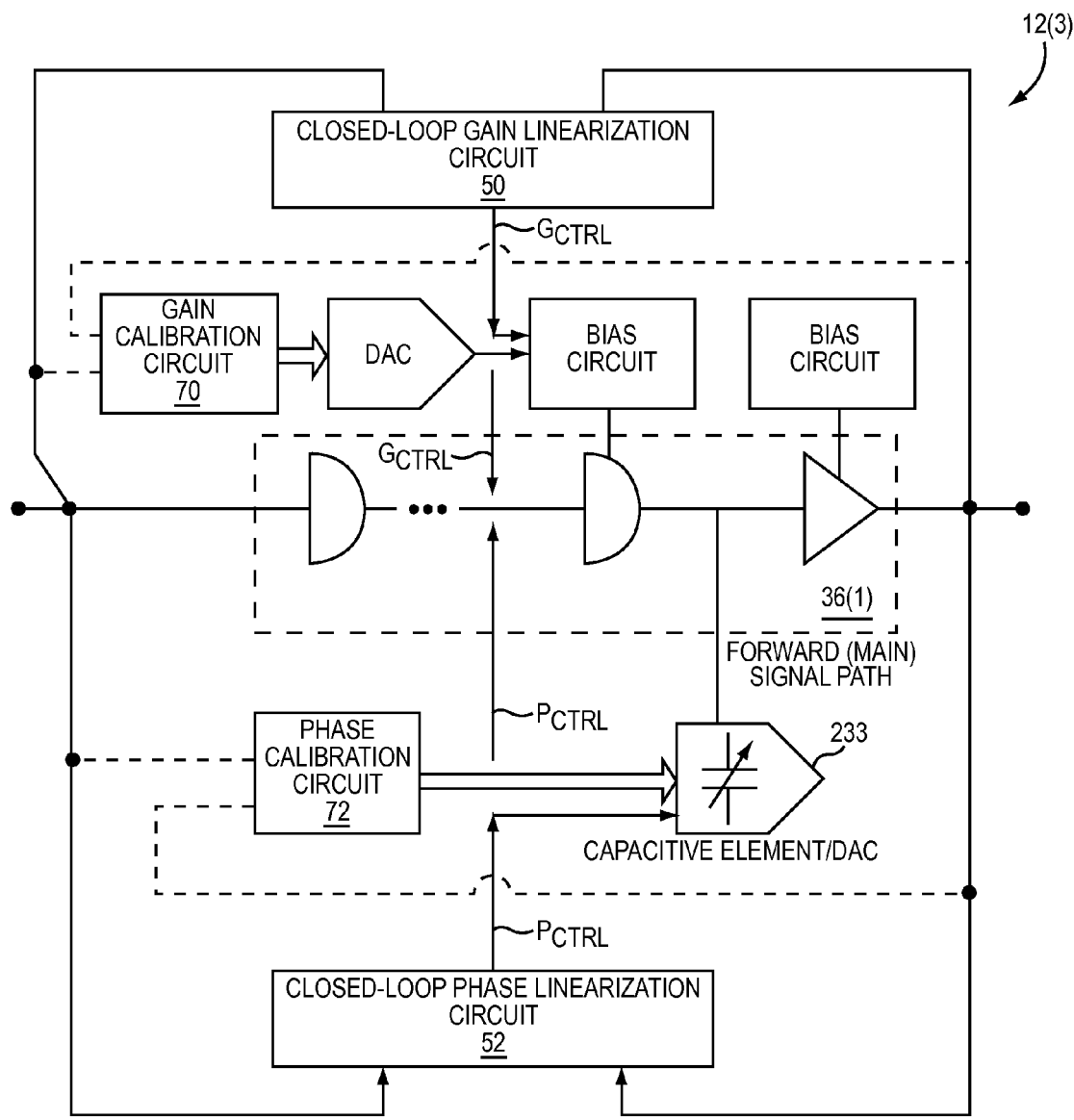
FIG. 6C illustrates another embodiment of an RF amplification device that provides calibration as described with respect to FIG. 6A.

FIG. 6C illustrates one embodiment of an RF amplification device 12(3) that provides calibration as described above with respect to FIG. 6A, where the calibrated open-loop response 224 is pushed by the calibration circuits 70, 72 towards alignment with the closed-loop response 212. With regard to the gain calibration circuit 70, the gain calibration circuit 70 may be completely separate or share hardware with the closed-loop gain linearization circuit 50. A control signal Gctrl generated by the closed-loop gain linearization circuit 50 either controls a bias circuit and/or is provided directly to the forward (main) signal path in order to change the response magnitude of the calibrated open-loop response 224 and the open-loop to closed-loop transition response 226 shown in FIG. 6A.

In the case of the phase calibration circuit 72, the phase calibration circuit 72 may be completely separate or share hardware with the closed-loop phase linearization circuit 52. A control signal Pctrl generated by closed-loop phase linearization circuit 52 controls a phase shifter 233 connected to and/or in the forward (main) signal path. For example, the phase shifter 233 may be implemented as a controlled capacitive element (analog or digital) in parallel with a resonator circuit. Other methods of phase shifting are also possible, such as, for example, phase interpolation. A calibration algorithm can be based, for example, on a nulling (bringing to zero) of an error signal at a designated power level when the feedback linearization loop is fully active.

Figure 6D:
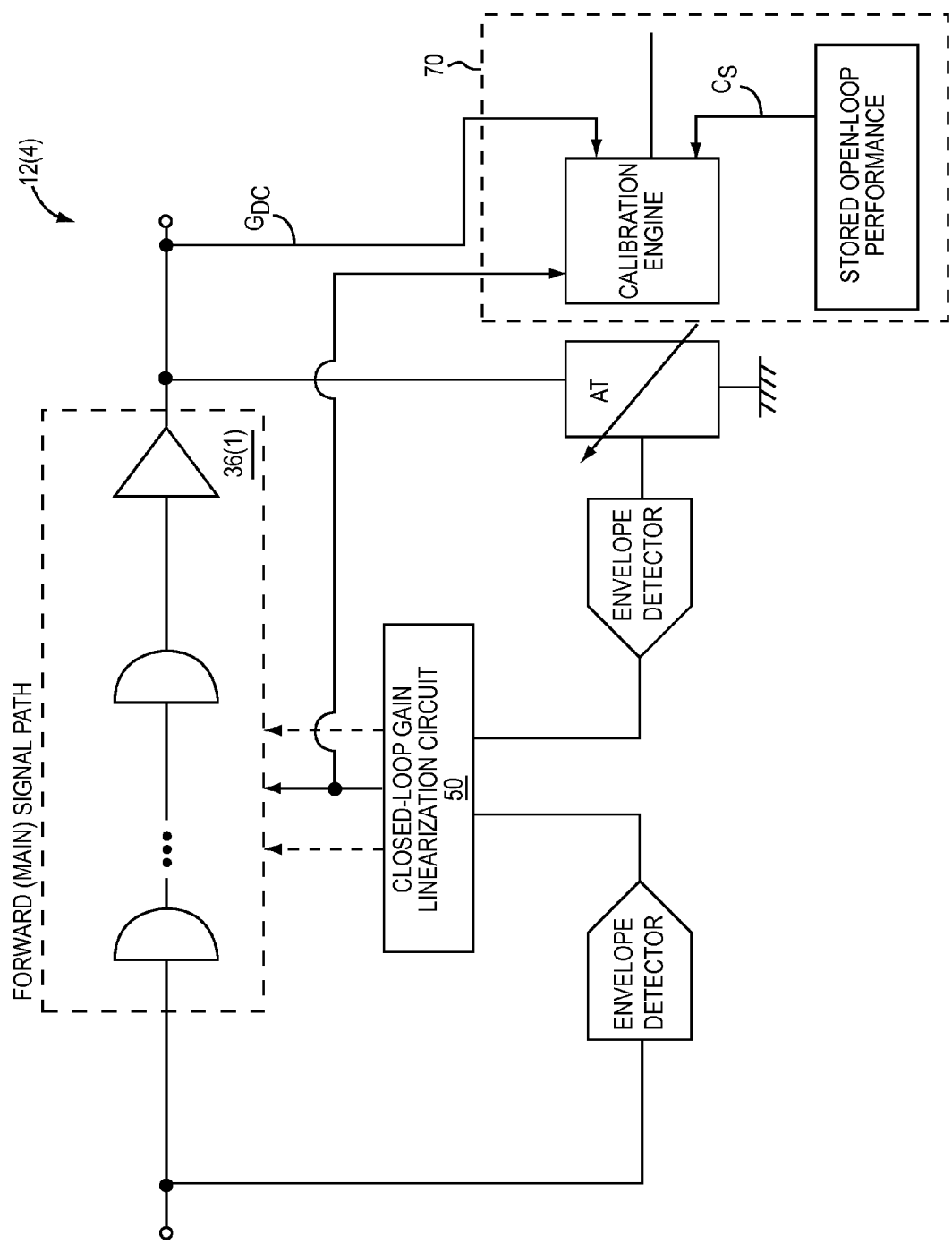
FIG. 6D illustrates still another exemplary embodiment of an RF amplification device that provides calibration as described with respect to FIG. 6B.

FIG. 6D shows an exemplary embodiment of an RF amplification device 12(4) that provides calibration as described above with respect to FIG. 6B, where the calibrated closedloop response 232 is pushed by the gain calibration circuit 70 toward the open-loop response 208. As designated in the following paragraphs, a calibration algorithm may be based on a nulling of a difference between a feedback signal level of a feedback signal $G_{DC}$ and a control signal level of a control signal CS. The control signal level of the control signal CS is measured at small signal levels and the feedback signal level of the feedback signal $G_{DC}$ is provided when the closed-loop gain linearization circuit 50 is fully active and not saturated.

A knob to perform the calibration in this case is a feedback path for the closed-loop phase linearization circuit 52. In this example, the phase calibration circuit 72 is using an attenuator AT in the feedback path to provide calibration. The attenuator AT changes the feedback path gain Gfeedback, and thus changes the calibrated closed-loop response 232 to the response magnitude RC=RO/(1+Gforward*Gfeedback).

Figure 7A:
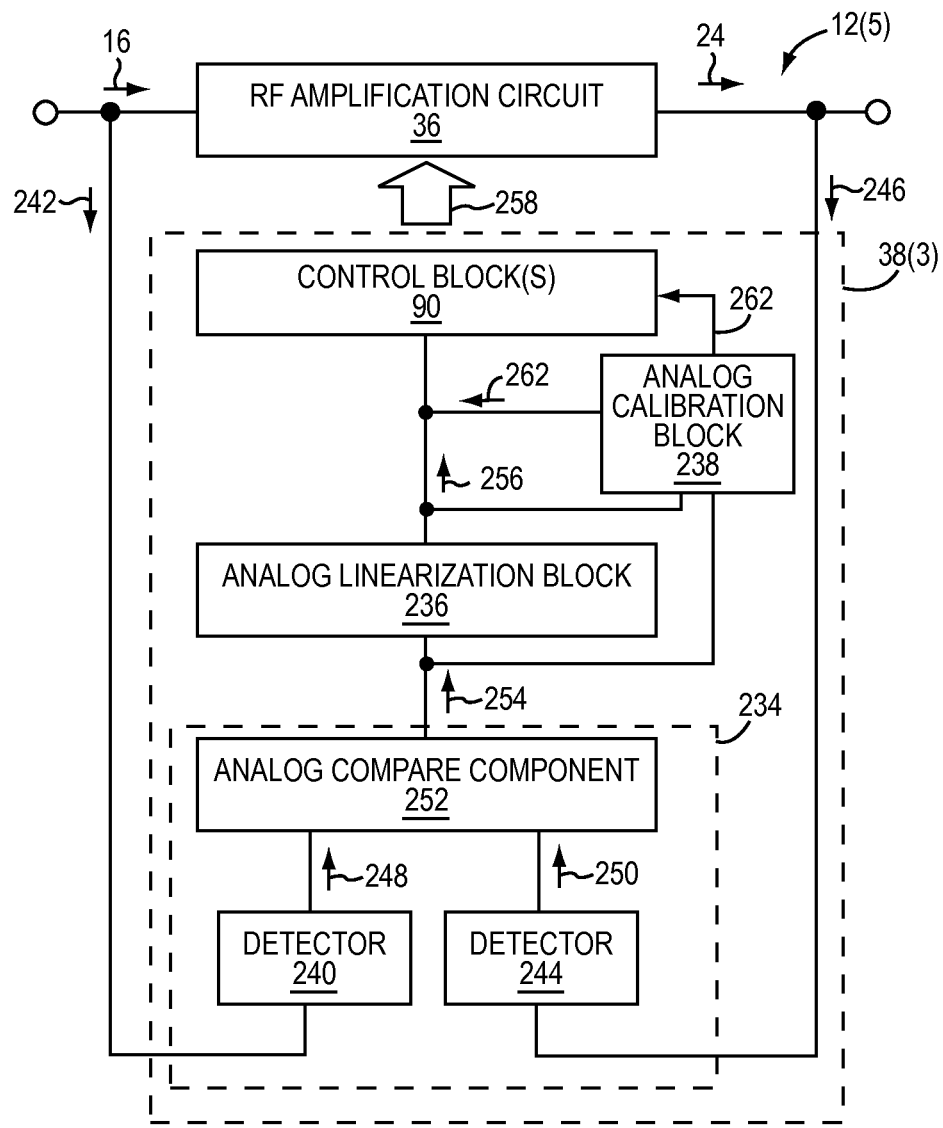
FIG. 7A illustrates one embodiment of an RF amplification device having an amplifier control circuit that uses analog techniques to provide either one of the calibrated response characteristics shown in FIGS. 6A and 6B.
Figure 7B:
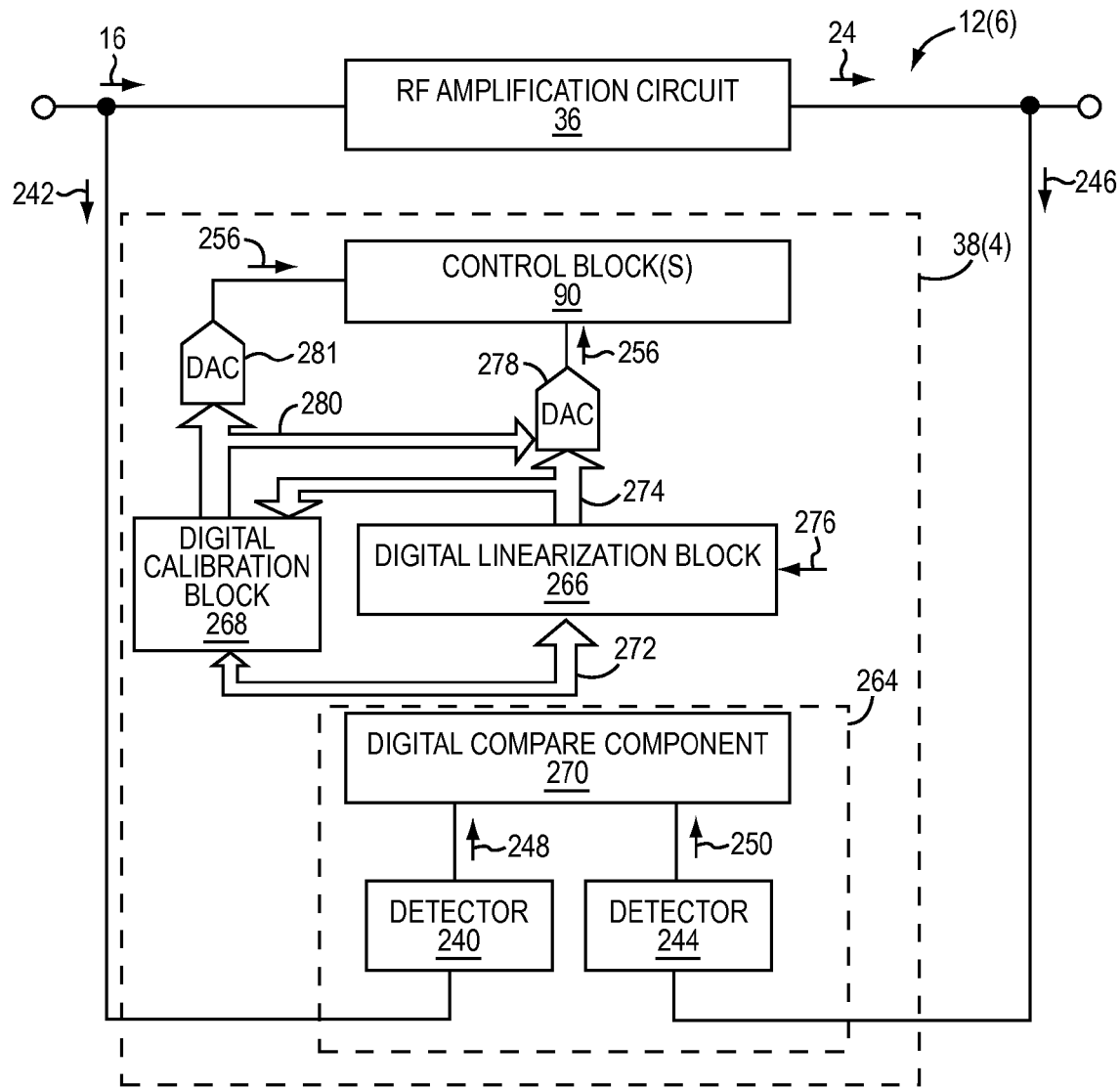
FIG. 7B illustrates another embodiment of an RF amplification device having an amplifier control circuit that uses digital techniques to provide either one of the calibrated response characteristics shown in FIGS. 6A and 6B.

FIG. 7A and FIG. 7B illustrate an RF amplification device 12(5) and an RF amplification device 12(6), each of which may be configured to provide either one of the calibrated response characteristic 222 shown in FIG. 6A and the calibrated response characteristic 228 shown in FIG. 6B. Each of the RF amplification devices 12(5), 12(6) is an embodiment of the RF amplification device 12(1) shown in FIG. 3. Accordingly, both of the RF amplification devices 12(5), 12(6) include the RF amplification circuit 36 described above with respect to FIG. 3. The RF amplification device 12(5) of FIG. 7A includes an amplifier control circuit 38(3), which utilizes analog techniques to control the transfer function of the RF amplification circuit 36. In contrast, the RF amplification device 12(6) includes an amplifier control circuit 38(4), which utilizes digital techniques to control the transfer function of the RF amplification circuit 36. However, it should be noted that in alternative embodiments, hybrid analog and digital techniques may be used to control the transfer function of the amplifier control circuit 38(4).

For both FIG. 7A and FIG. 7B, the amplifier control circuits 38(3), 38(4) are discussed generically with respect to the closed-loop gain linearization circuit 50 (shown in FIG. 3) and the gain calibration circuit 70 (shown in FIG. 3), and with respect to the closed-loop phase linearization circuit 52 (shown in FIG. 3) and the phase calibration circuit 72 (shown in FIG. 3). This is because specific embodiments of the components shown in the amplifier control circuits 38(3), 38(4) can be designed for the closed-loop gain linearization circuit 50 and the gain calibration circuit 70 and for the closed-loop phase linearization circuit 52 and the phase calibration circuit 72. The difference, of course, would be that the components of the amplifier control circuits 38(3), 38(4) would be designed for gain linearization and gain calibration in one case and for phase linearization and phase calibration in the other case. Finally, it should also be noted that specific embodiments of both the RF amplification device 12(5) and the RF amplification device 12(6) can be used if the calibrated response characteristic 222, 228 being provided is either a calibrated gain response or a calibrated phase response.

Referring now to FIG. 7A, the amplifier control circuit 38(3) includes an error detection circuit 234, an analog linearization block 236, an analog calibration block 238, and one or more of the control blocks 90 (e.g., the gain control block 90A-90I shown in FIG. 4). The error detection circuit 234 includes a detector 240 coupled to receive a reference signal 242 having a reference signal level that indicates the signal power level of the RF signal 24. The error detection circuit 234 also has a detector 244 configured to receive a feedback signal 246 having a feedback signal level that indicates the signal power level of the amplified RF signal 26. The detector 240 is configured to generate a reference control signal 248 having a reference control signal level that indicates a target magnitude for the relevant response characteristic. In other words, the detector 240 extracts the magnitude for the setting the relevant set point of the response characteristic based on the reference signal 242. If the components of the amplifier control circuit 38(3) shown in FIG. 7A are being utilized to control gain, the detector 240 may generate the reference control signal 248 such that the reference control signal level indicates a target amplitude. On the other hand, if the components of the amplifier control circuit 38(3) shown in FIG. 7A are being used to control phase shifts, the detector 240 may generate the reference control signal 248 such that the reference control signal level indicates a target phase.

The detector 244 is configured to generate a feedback control signal 250 having a feedback control signal level that indicates a magnitude for the relevant response characteristic of the amplified RF signal 26 based on the feedback signal 246. In other words, the detector extracts the magnitude of the amplified RF signal 26 relevant to the relevant response characteristic based on the feedback signal 246. If the components of the amplifier control circuit 38(3) shown in FIG. 7A are being utilized to control the gain response, the detector 244 generates the feedback control signal 250 such that the reference control signal level indicates an amplitude of the amplified RF signal 26. On the other hand, if the components of the amplifier control circuit 38(3) shown in FIG. 7A are being utilized to control the phase response, the detector 244 generates the feedback control signal 250 such that the feedback control signal level indicates a phase of the amplified RF signal 26.

In the error detection circuit 234 shown in FIG. 7A, the error detection circuit 234 includes an analog compare component 252 configured to receive the reference control signal 248 and the feedback control signal 250. The analog compare component 252 compares the reference control signal level and the feedback control signal level and generates an error signal 254. The error signal 254 has an error signal level that indicates a difference between the relevant set point and the magnitude for the relevant response characteristic of the amplified RF signal 26. In one embodiment, the analog compare component 252 is a differential amplifier.

As shown in FIG. 7A, the analog linearization block 236 is configured to receive the error signal 254 from the analog compare component 252. The analog linearization block 236 may be, or may be part of, the closed-loop gain linearization circuit 50 (shown in FIG. 3) or the closed-loop phase linearization circuit 52 (shown in FIG. 3), depending on the response characteristic being linearized by the components shown in the amplifier control circuit 38(3) in FIG. 7A. In response to the error signal 254, the analog linearization block 236 is configured to generate a linearization control signal 256 having a linearization control signal level. More specifically, the analog linearization block 236 adjusts the linearization control signal level of the linearization control signal 256 based on the error signal level so as to reduce the difference between the relevant set point and the magnitude for the relevant response characteristic of the amplified RF signal 26. The linearization control signal 256 may be a gain control signal or a phase control signal, depending on the relevant response characteristic being controlled.

One or more of the control block(s) 90 are configured to receive the linearization control signal 256 from the analog linearization block 236. The control block(s) 90 are configured to generate a control output 258 that includes one or more control signals to control the transfer function of the RF amplification circuit 36. In this embodiment, the control block(s) 90 generate the control output 258 based, at least partially, on the linearization control signal level of the linearization control signal 256. The control output 258 may include a control signal for controlling a variety of operational characteristics of the RF amplification circuit 36. In response to the control output 258, the control block(s) 90 shown in FIG. 7A adjust the relevant response characteristic to reduce (and possibly substantially eliminate) the difference between the relevant set point and the magnitude for the relevant response characteristic of the amplified RF signal 26. Thus, the closed-loop response 212 shown in FIG. 6A and the calibrated closed-loop response 232 shown in FIG. 6B are linearized as described above with respect to FIGS. 6A and 6B. It should be noted that the control block(s) 90 may receive other linearization control signals, like the linearization control signal 256, depending on the different operational characteristics being controlled. In one embodiment, the analog linearization block 236 is an analog RF filter, and thus the linearization control signal 256 is simply a filter version of the error signal 254.

As shown in FIG. 7A, the amplifier control circuit 38(3) includes an analog calibration block 238. The analog calibration block 238 may be, or may be part of, the gain calibration circuit 70 (shown in FIG. 3) or the phase calibration circuit 72 (shown in FIG. 3), depending on the response characteristic being linearized by the components of the amplifier control circuit 38(3) shown in FIG. 7A. The analog calibration block 238 is also configured to receive the linearization control signal 256. The analog calibration block 238 is configured to store a stored signal level set in accordance with the linearization control signal level of the linearization control signal 256 when the signal power level of the RF signal 24 is at a calibration power level during calibration, as explained in further detail below. The linearization control signal level may be a current level or a voltage level. The analog calibration block 238 may be configured to store the stored signal level so that the stored signal level indicates a linearization control signal level at the calibration power level during calibration. For example, the analog calibration block 238 may include a store and hold circuit which stores the stored signal level.

To reduce the difference D (shown in FIGS. 6A and 6B), the analog calibration block 238 is configured to generate a calibration signal 262 that is applied to the linearization control signal 256 before the linearization control signal 256 is received by the control block(s) 90. The calibration signal 262 has a calibration signal level that is set in accordance with the stored signal level. In this manner, one or more of the control block(s) 90 are configured to receive the calibration signal 262 and reduce the difference D in either the calibrated response characteristic 222 shown in FIG. 6A or the calibrated response characteristic 228 shown in FIG. 6B. Furthermore, the calibration signal 262 may be a gain calibration signal or a phase calibration signal, depending on the relevant response characteristic being controlled by the components in the amplifier control circuit 38(3). Finally, note that other calibration blocks similar to the analog calibration block 238 may be provided to generate additional calibration signals for the control block(s) 90. Also, alternatively, the analog calibration block 238 provides the calibration signal 262 directly to the control block(s) 90.

Referring now to FIG. 7B, the amplifier control circuit 38(4) includes an error detection circuit 264, a digital linearization block 266, a digital calibration block 268, and one or more of the control block(s) 90 (e.g., the gain control blocks 90A-90I shown in FIG. 4). Like the error detection circuit 234 shown in FIG. 7A, the error detection circuit 264 shown in FIG. 7B includes the detector 240 and the detector 244, which generate the reference control signal 248 and the feedback control signal 250, respectively, as described above. However, in this embodiment, the error detection circuit 264 includes a digital compare component 270 configured to receive the reference control signal 248 and the feedback control signal 250. The digital compare component 270 compares the reference control signal level of the reference control signal 248 and the feedback control signal level of the feedback control signal 250. By comparing the reference control signal level of the reference control signal 248 and the feedback control signal level of the feedback control signal 250, the digital compare component 270 is configured to generate a digital error output 272. The digital error output 272 is configured to represent an error value that indicates a difference between the relevant set point and the magnitude for the relevant response characteristic of the amplified RF signal 26. In one embodiment, the digital compare component 270 is configured to convert the reference control signal level into a first digital input that represents a reference control value that indicates the reference control signal level, and to convert the feedback control signal level into a second digital input that represents a feedback control value that indicates the feedback control signal level. The digital compare component 270 is then configured to perform digital operations on the first digital input and the second digital input so as to generate the digital error output 272.

As shown in FIG. 7B, the digital linearization block 266 is configured to receive the digital error output 272 from the digital compare component 270. The digital linearization block 266 may be, or may be part of, the closed-loop gain linearization circuit 50 (shown in FIG. 3) or the closed-loop phase linearization circuit 52 (shown in FIG. 3), depending on the response characteristic being linearized by the components shown in the amplifier control circuit 38(4) in FIG. 7B. In response to the digital error output 272, the digital linearization block 266 is configured to generate a digital linearization control input 274 representing a linearization control value based on the error value of the digital error output 272. The digital linearization block 266 may be synchronized by a clock signal 276. The digital linearization control input 274 may be configured to store the linearization control value within internal registers and generate the digital linearization control input 274 that represents the linearization control value during each clock cycle of the clock signal 276. In one embodiment, the digital linearization block 266 is a digital up/down counter that accumulates the error value of the digital error output 272, where the accumulation is synchronized by the clock signal 276. Through the accumulation of the error value of the digital linearization block 266, the digital linearization block 266 may be configured to calculate the linearization control value during each clock cycle of the clock signal 276. As such, the digital linearization block 266 is driven by the clock signal 276 to perform digital filtering.

As shown in FIG. 7B, a digital-to-analog converter (DAC) 278 is configured to receive the digital linearization control input 274 from the digital linearization block 266. The DAC 278 is configured to convert the digital linearization control input 274 into the linearization control signal 256. The DAC 278 is thus configured to set the linearization control signal level in accordance with the linearization control value. Accordingly, the digital linearization block 266 is configured to adjust the linearization control signal level of the linearization control signal 256 based on the error value so as to reduce the difference between the relevant set point and the magnitude for the relevant response characteristic of the amplified RF signal 26. The linearization control signal 256 may be a gain control signal or a phase control signal, depending on the relevant response characteristic being controlled.

One or more of the control block(s) 90 are configured to receive the linearization control signal 256 from the DAC 278. The control block(s) 90 are configured to generate a control output 258 that includes one or more control signals to control the transfer function of the RF amplification circuit 36. In this embodiment, the control block(s) 90 generate the control output 258 based, at least partially, on the linearization control signal level of the linearization control signal 256 and thus, on the linearization control value. The control output 258 may include control signals for controlling a variety of operational characteristics of the RF amplification circuit 36, which is demonstrated by the amplifier control circuit 38(2) shown in FIG. 4). In response to the control output 258, the control block(s) 90 shown in FIG. 7B adjust the relevant response characteristic to reduce (and possibly substantially eliminate) the difference between the relevant set point and the magnitude for the relevant response characteristic of the amplified RF signal 26. Thus, the closed-loop response 212 shown in FIG. 6A and the calibrated closed-loop response 232 shown in FIG. 6B are linearized as described above with respect to FIGS. 6A and 6B. It should be noted that the control block(s) 90 may receive other linearization control signals, like the linearization control signal 256, depending on the different operational characteristics being controlled.

As shown in FIG. 7B, the amplifier control circuit 38(4) includes the digital calibration block 268. For example, the digital calibration block 268 may include internal registers that store a calibration control value. The digital calibration block 268 may be, or may be part of, the gain calibration circuit 70 (shown in FIG. 3) or the phase calibration circuit 72 (shown in FIG. 3), depending on the response characteristic being linearized by the components of the amplifier control circuit 38(4) shown in FIG. 7B. The calibration control value is the linearization control value of the digital linearization control input 274 provided during calibration at a calibration power level, as explained in further detail below. Accordingly, the digital calibration block 268 is also configured to receive the digital linearization control input 274 in order to set the calibration control value during calibration. To reduce the difference D (shown in FIGS. 6A and 6B), the digital calibration block 268 is configured to generate a digital calibration control input 280 that represents the calibration control value stored by the digital calibration block 268.

To provide the calibrated response characteristic 222 shown in FIG. 6A, the digital linearization block 266 may request the digital calibration control input 280 in response to sensing that the error value represented by the digital error output 272 is below a threshold error value. The threshold error value is set to indicate the threshold power level 218 (shown in FIG. 6A). Accordingly, when the error value of the digital error output 272 is below the threshold error value, the signal power level of the RF signal 24 is below the threshold power level 218 (shown in FIG. 6A). Alternatively, the threshold error value may be set to indicate the threshold power level 216 (shown in FIG. 6A). Accordingly, when the error value of the digital error output 272 is below the threshold error value, the signal power level of the RF signal 24 is below the threshold power level 216 (shown in FIG. 6A).

In response to the digital calibration control input 280, the digital linearization block 266 is configured to generate the digital linearization control input 274 with the linearization control value set to equal the calibration control value of the digital calibration control input 280. Thus, the DAC 278 generates the linearization control signal 256 having the linearization control signal level set in accordance with the calibration control value. The calibration signal level is provided so that the difference D (shown in FIG. 6A) is reduced, and in this case, eliminated. Accordingly, the calibrated open-loop response 224 (shown in FIG. 6A) and the calibrated open-loop to closed-loop transition response 226 (shown in FIG. 6A) are adjusted to the have the same response magnitude RC as the closed-loop response 212 (shown in FIG. 6A). Alternatively, the digital calibration block 268 may transmit the digital linearization control input 274 directly to a DAC 281, which generates the linearization control signal 256.

To provide the calibrated response characteristic 228 shown in FIG. 6B, the digital linearization block 266 may request the digital calibration control input 280 in response to sensing that the error value represented by the digital error output 272 is above a threshold error value. The threshold error value is set to indicate the threshold power level 216 (shown in FIG. 6B). Accordingly, when the error value of the digital error output 272 is above the threshold error value, the signal power level of the RF signal 24 is above the threshold power level 216 (shown in FIG. 6B). Alternatively, the threshold error value may be set to indicate the threshold power level 218 (shown in FIG. 6B). Accordingly, when the error value of the digital error output 272 is above the threshold error value, the signal power level of the RF signal 24 is above the threshold power level 218 (shown in FIG. 6B). While the error value is above the threshold error value, the digital linearization block 266 is configured to generate the digital linearization control input 274 with the linearization control value offset by the calibration control value of the digital calibration control input 280. Thus, the DAC 278 generates the linearization control signal 256 having the linearization control signal level offset in accordance with the calibration control value. The calibration signal level is provided so that the difference D (shown in FIG. 6B) is reduced, and in this case, eliminated. Accordingly, the calibrated closed-loop response 232 (shown in FIG. 6A) and the calibrated open-loop to closed-loop transition response 230 (shown in FIG. 6A) are adjusted to the have the same response magnitude RO as the open-loop response 208 (shown in FIG. 6B).

Referring now to FIGS. 3, 5, 7A, and 7B, the analog calibration block 238 and the digital calibration block 268 are calibrated during a calibration period. For continuous mode communications, the calibration period may be provided while the signal power level of the RF signal 24 is ramping up for communications. With regard to burst mode communications, the calibration period may be provided at a beginning of an initial burst or at a beginning of each burst. A calibration point occurs when the signal power level of the RF signal 24 is at the calibration power level during the calibration period. During the calibration period, the transfer function of the RF amplification circuit 36 is provided as shown by the uncalibrated response characteristic 204 shown in FIG. 5. The calibration point is set between the non-linearity pure open-loop threshold power level 206 and the threshold power level 218. By setting the calibration point above the threshold power level 218, the closed-loop gain linearization circuit 50 and the closed-loop phase linearization circuit 52 are fully activated. Furthermore, this avoids compression and expansion distortion in the gain response and delays or advances in the phase response since the pure open-loop response characteristic 202 remains significantly linear below the non-linearity pure open-loop threshold power level 206.

Any combination of analog and/or digital calibration circuits and analog and/or digital linearization circuits may be provided in an amplifier control circuit. The amplifier control circuit may use similar or different linearization and/or calibration circuits to control the gain and the phase. As mentioned above, the control of both the closed-loop linearization circuits 50, 52 and the calibration circuits 70, 72 may be common or separate, similar to the embodiment shown in FIG. 4. Furthermore, the closed-loop linearization circuits 50, 52 and the calibration circuits 70, 72 may use one or multiple control points in the forward (main) RF signal path provided by the RF amplification circuit 36. The closed-loop linearization circuits 50, 52 and the calibration circuits 70, 72 may use the same or different control points, which may be multiple, and it is also possible that only some of the control points are the same and some are different.

With regard to the analog calibration block 238 shown in FIG. 7A, the linearization control signal level of the linearization control signal indicates the difference D of the response magnitude between the open-loop response 208 and the closed-loop response 212 at the calibration power level of the calibration point (which is set between the non-linearity pure open-loop threshold power level 206 and the threshold power level 218). By storing the control signal level at the calibration point, the analog calibration block 238 is configured to generate the calibration signal 262 having the calibration signal level set to reduce the difference D and provide either the calibrated response characteristic 222 shown in FIG. 6A or the calibrated response characteristic 228 shown in FIG. 6B.

With regard to the digital calibration block 268 shown in FIG. 7B, the linearization control value of digital linearization control input 274 indicates the difference D of the response magnitude between the open-loop response 208 and the closed-loop response 212 at the calibration power level of the calibration point (which is set between the non-linearity pure open-loop threshold power level 206 and the threshold power level 218). By storing the calibration control value in accordance to the linearization control value of the digital linearization control input 274 at the calibration point, the digital linearization control input 274 is configured to generate the digital calibration control input 280 having the calibration control value set to reduce the difference D and provide either the calibrated response characteristic 222 shown in FIG. 6A or the calibrated response characteristic 228 shown in FIG. 6B.

Figure 8A:
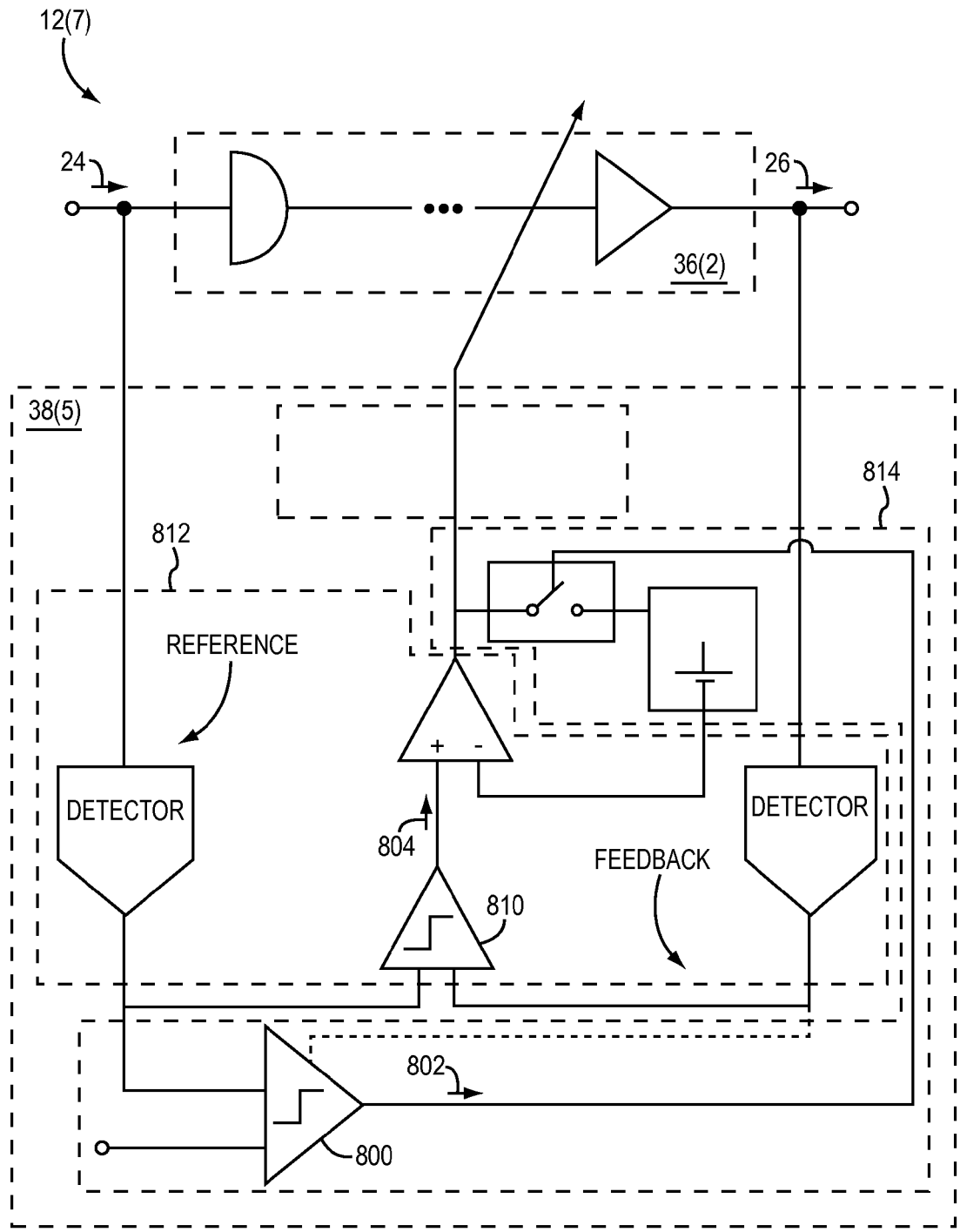
FIG. 8A illustrates one embodiment of an RF amplification device having an amplifier control circuit that uses sampling of feedback at threshold power with the single point calibration described with respect to FIGS. 8B and 8C.
Figure 8B:
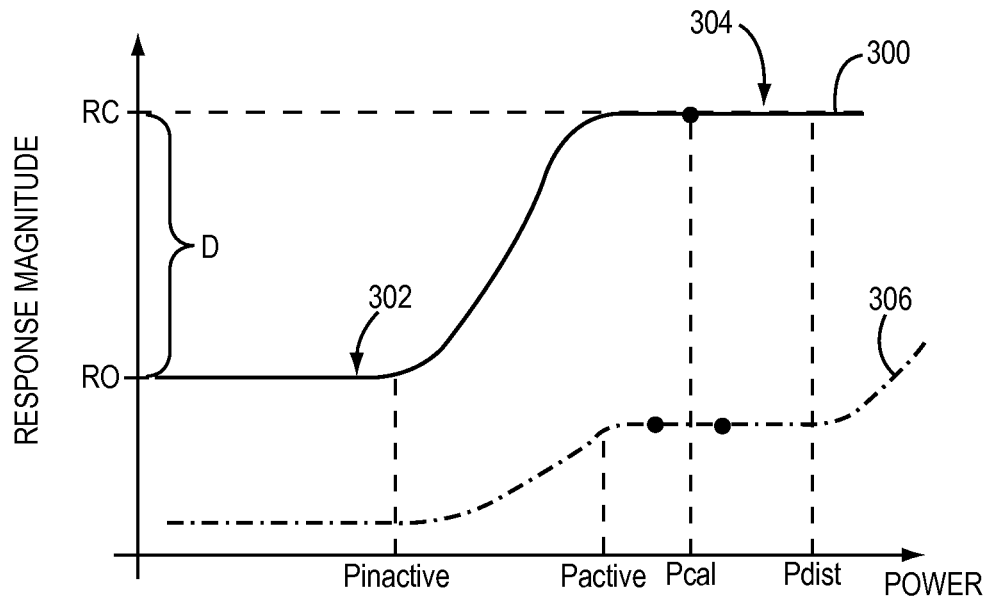
FIG. 8B illustrates embodiments of a calibrated response characteristic, an uncalibrated response characteristic, and a pure open-loop response characteristic where a calibration power level is selected and single point calibration is performed by the RF amplification device shown in FIG. 8A.
Figure 8C:
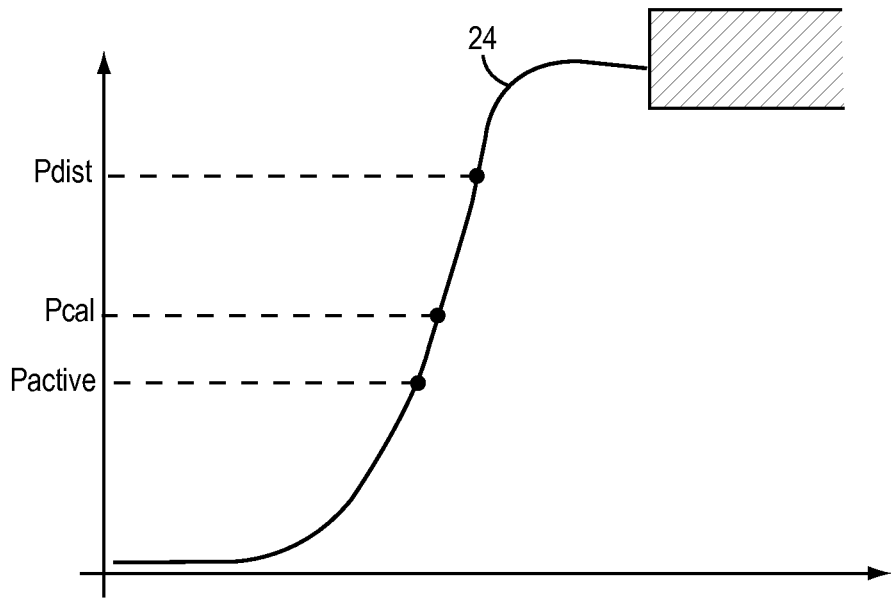
FIG. 8C illustrates one embodiment of a timing diagram for performing the single point calibration for the RF amplification device shown in FIG. 8A.

FIG. 8A illustrates an embodiment of exemplary RF amplification device 12(7) having an exemplary RF amplification circuit 36(2) and an exemplary amplifier control circuit 38(5). FIG. 8B illustrates a response characteristic 300 where the response magnitude RO of an open-loop response 302 is aligned with the response magnitude RC of a closed-loop response 304 for the RF amplification device 12(7) shown in FIG. 8A. FIG. 8B also shows a pure open-loop response 306. FIG. 8C illustrates a graph that plots a signal power level of the RF signal 24 versus time while operating the RF amplification device 12(7) shown in FIG. 8A during a burst communication.

Referring now to FIGS. 8A-8C, as the RF signal 24 ramps up during the burst communication and crosses a calibration power level Pcal, a comparator 800 produces a sample control signal 802 that determines sampling and storing of an error signal 804 provided by a comparator 810. At the calibration power level Pcal, a closed-loop linearization circuit 812 with the comparator 810 is fully active, non-saturated, and does not respond to distortion. The error signal level of the error signal 804 provided at the calibration power level Pcal thus represents the control needed to bring the difference D between the response magnitude RO and the response magnitude RO to zero. Adding this sampled error level during the entire normal operation of the RF amplification device 12(7) allows for distortion-free operation at low and moderate power levels with the closed-loop linearization circuit 812 and a calibration circuit 814. In a continuous communication, a first calibration can be performed at start-up to perform an initial alignment of the open-loop response 302 and the closed-loop response 304. Any subsequent drift can be corrected with small adjustments when the RF signal 24 crosses the calibration power level Pcal.

Those skilled in the art will recognize improvements and modifications to the embodiments of the present disclosure. All such improvements and modifications are considered within the scope of the concepts disclosed herein and the claims that follow.

What is claimed is:

1. A radio frequency (RF) amplification device, comprising:
   an RF amplification circuit configured to receive an RF signal and generate an amplified RF signal in accordance with a transfer function; and
   an amplifier control circuit operably associated with the RF amplification circuit wherein the amplifier control circuit comprises:
   a closed-loop linearization circuit configured to be activated such that the transfer function of the RF amplification circuit defines a closed-loop response and inactivated such that the transfer function of the RF amplification circuit defines an open-loop response; and
   a calibration circuit configured to control the RF amplification circuit to reduce a difference between the open-loop response and the closed-loop response of the transfer function based on a difference of the RF signal and the amplified RF signal.

2. The RF amplification device of claim 1 wherein the closed-loop linearization circuit is configured to linearize a response characteristic of the transfer function of the RF amplification circuit so that the response characteristic defines the closed-loop response while the closed-loop linearization circuit is activated and the response characteristic defines the open-loop response while the closed-loop linearization circuit is inactive.

3. The RF amplification device of claim 2 wherein:
   the closed-loop linearization circuit is a closed-loop gain linearization circuit;
   the response characteristic of the transfer function linearized by the closed-loop gain linearization circuit is a gain response that defines the closed-loop response as a closed-loop gain response and the open-loop response as an open-loop gain response; and
   the calibration circuit is a gain calibration circuit that is configured to reduce the difference between the open-loop gain response and the closed-loop gain response.

4. The RF amplification device of claim 2 wherein:
   the closed-loop linearization circuit is a closed-loop phase linearization circuit;
   the response characteristic of the transfer function linearized by the closed-loop phase linearization circuit is a phase response that defines the closed-loop response as a closed-loop phase response and the open-loop response as an open-loop phase response; and
   the calibration circuit is a phase calibration circuit that is configured to reduce the difference between the open-loop phase response and the closed-loop phase response.

5. The RF amplification device of claim 4 wherein the amplifier control circuit further comprises:
   a closed-loop gain linearization circuit configured to linearize a gain response of the transfer function of the RF amplification circuit so that the gain response has a closed-loop gain response while the closed-loop gain linearization circuit is activated and the gain response has an open-loop gain response while the closed-loop gain linearization circuit is inactive; and a gain calibration circuit configured to reduce a second difference between the open-loop gain response and the closed-loop gain response.

6. The RF amplification device of claim 1 wherein the calibration circuit is configured to reduce the difference between the open-loop response and the closed-loop response by being configured to adjust the closed-loop response to reduce the difference.

7. The RF amplification device of claim 1 wherein the calibration circuit is configured to reduce the difference between the open-loop response and the closed-loop response by being configured to adjust the open-loop response to reduce the difference.

8. The RF amplification device of claim 1 wherein the calibration circuit is configured to reduce the difference such that the difference is substantially eliminated.

9. The RF amplification device of claim 1 wherein the closed-loop linearization circuit is configured to be activated such that the transfer function of the RF amplification circuit defines the closed-loop response when a signal power level of the RF signal is above a threshold power level.

10. The RF amplification device of claim 1 wherein the closed-loop linearization circuit is further configured to be inactive to provide the open-loop response when a signal power level of the RF signal is below a threshold power level.

11. The RF amplification device of claim 10 wherein the closed-loop linearization circuit is further configured to be active when the signal power level of the RF signal is above a second threshold power level.

12. The RF amplification device of claim 11 wherein:
the closed-loop linearization circuit is configured to be partially active while the signal power level of the RF signal is between the threshold power level and the second threshold power level so that that the transfer function defines an open-loop to closed-loop transition response;
the calibration circuit results in a finite error at alignment of the open-loop response and the closed-loop response; and
the closed-loop linearization circuit and the calibration circuit are configured to operate in combination to reduce a second difference between the open-loop to closed-loop transition response and the closed-loop response.

13. The RF amplification device of claim 11 wherein:
the closed-loop linearization circuit is configured to be partially active while the signal power level of the RF signal is between the threshold power level and the second threshold power level so that that the transfer function defines an open-loop to closed-loop transition response; and
the closed-loop linearization circuit and the calibration circuit are configured to operate in combination to reduce a second difference between the open-loop to closed-loop transition response and the open-loop response.

14. The RF amplification circuit of claim 1 wherein:
the amplifier control circuit is configured to generate a control output that adjusts the transfer function of the RF amplification circuit;
the closed-loop gain linearization circuit is further configured to adjust the control output so as to linearize a response characteristic of the transfer function when the closed-loop linearization circuit is active, wherein the response characteristic defines the open-loop response and the closed-loop response; and
the calibration circuit is further configured to adjust the control output so as to reduce the difference between the open-loop response and the closed-loop response.

15. The RF amplification circuit of claim 14 wherein:
the closed-loop linearization circuit comprises an error detection circuit configured to generate an error signal having an error signal level that indicates a difference between a set point and a magnitude of the amplified RF signal;
the calibration circuit is configured to generate a calibration signal having a calibration signal level; and
the amplifier control circuit further comprises one or more control blocks and is operably associated with the closed-loop linearization circuit and the calibration circuit, wherein the one or more control blocks are configured to:
generate the control output based on the error signal level of the error signal so that the response characteristic of the transfer function is linearized while the closed-loop linearization circuit is activated; and
generate the control output based on the calibration signal level of the calibration signal so as to reduce the difference between the open-loop response and the closed-loop response.

16. The RF amplification circuit of claim 15 wherein:
the calibration circuit is further configured to:
store a stored signal level; and
generate the calibration signal such that the calibration signal level is set in accordance with the stored signal level.

17. The RF amplification circuit of claim 16, wherein:
the closed-loop linearization circuit is further configured to be active when a signal power level of the RF signal is above a first threshold power level;
the transfer response is configured to define a pure open-loop response characteristic when both the closed-loop linearization circuit and the calibration circuit are turned off, such that the pure open-loop response characteristic is substantially linear when the signal power level of the RF signal is below a second threshold power level and is substantially non-linear when the signal power level of the RF signal is above the second threshold power level; and
the calibration circuit is further configured to be calibrated during a calibration period and wherein, during the calibration period, the calibration circuit is configured to store the stored signal level based on the error signal level of the error signal when the signal power level of the RF signal is at a calibration power level that is between the first threshold power level and the second threshold power level.

18. The RF amplification circuit of claim 14 wherein:
the closed-loop linearization circuit comprises an error detection circuit configured to generate a digital error output representing an error value that indicates a difference between a set point and a magnitude of the amplified RF signal;
the calibration circuit is configured to generate a digital calibration control input representing a calibration value; and
the amplifier control circuit further comprises one or more control blocks operably associated with the closed-loop linearization circuit and the calibration circuit, wherein the one or more control blocks is configured to:

generate the control output based on the error value of the digital error output so that the response characteristic of the transfer function is linearized while the closed-loop linearization circuit is activated; and generate the control output based on the calibration value of the digital calibration control input so as to reduce the difference between the open-loop response and the closed-loop response.

19. The RF amplification circuit of claim 18 wherein:
the calibration circuit is further configured to:
store the calibration value; and
generate the digital calibration control input representing the calibration value that is stored.

20. The RF amplification circuit of claim 19 wherein:
the closed-loop linearization circuit is further configured to be active when a signal power level of the RF signal is above a first threshold power level;
the transfer response is configured to define a pure open-loop response characteristic when both the closed-loop linearization circuit and the calibration circuit are turned off, such that the pure open-loop response characteristic is substantially linear when the signal power level of the RF signal is below a second threshold power level and is substantially non-linear when the signal power level of the RF signal is above the second threshold power level; and
the calibration circuit is further configured to be calibrated during a calibration period, wherein during the calibration period, the calibration circuit is configured to store the calibration value based on the error value of the digital error output when the signal power level of the RF signal is at a calibration power level that is between the first threshold power level and the second threshold power level.

21. A method of providing amplification to a radio frequency (RF) signal, comprising:
receiving the RF signal and generating an amplified RF signal with an RF amplification circuit and in accordance with a transfer function of the RF amplification circuit;
linearizing a response characteristic of the RF amplification circuit so that the response characteristic defines a closed-loop response when linearization is being provided and the response characteristic defines an open-loop response when linearization is not being provided; and
reducing a difference between the open-loop response and the closed-loop response of the transfer function based on a difference of the RF signal and the amplified RF signal.

22. The method of claim 21 wherein the response characteristic is a gain response.

23. The method of claim 21 wherein the response characteristic is a phase response.

24. The method of claim 21 wherein reducing the difference between the open-loop response and the closed-loop response comprises adjusting the closed-loop response to reduce the difference.

25. The method of claim 21 wherein reducing the difference between the open-loop response and the closed-loop response comprises adjusting the open-loop response to reduce the difference.

26. The RF amplification device of claim 1 wherein to reduce the difference between the open-loop response and the closed-loop response of the transfer function, the calibration circuit is further configured to control the RF amplification circuit to:
determine an amplitude associated with the amplified RF signal;
determine a set point based on a power level associated with the RF signal; and
control a gain of the RF amplification circuit based on a difference between the amplitude associated with the amplified RF signal and the set point.

27. The RF amplification device of claim 26 wherein to reduce the difference between the open-loop response and the closed-loop response of the transfer function, the calibration circuit is further configured to control the RF amplification circuit to:
determine a phase associated with the amplified RF signal;
determine a phase associated with the RF signal; and
control a delay provided by the RF amplification circuit based on a difference between the phase associated with the amplified RF signal and the phase associated with the RF signal.

28. The method of claim 21 wherein reducing the difference between the open-loop response and the closed-loop response of the transfer function further comprises:
determining an amplitude associated with the amplified RF signal;
determining a set point based on a power level associated with the RF signal; and
controlling a gain of the RF amplification circuit based on a difference between the amplitude associated with the amplified RF signal and the set point.

29. The method of claim 28 wherein reducing the difference between the open-loop response and the closed-loop response of the transfer function further comprises:
determining a phase associated with the amplified RF signal;
determining a phase associated with the RF signal; and
controlling a delay provided by the RF amplification circuit based on a difference between the phase associated with the amplified RF signal and the phase associated with the RF signal.

* * * * *